(12) United States Patent
Nakahara

(10) Patent No.: US 8,390,340 B2
(45) Date of Patent: Mar. 5, 2013

(54) LOAD DRIVING DEVICE

(75) Inventor: Akihiro Nakahara, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 135 days.

(21) Appl. No.: 13/090,488

(22) Filed: Apr. 20, 2011

(65) Prior Publication Data

US 2011/0279152 A1    Nov. 17, 2011

(30) Foreign Application Priority Data

May 11, 2010  (JP) ................................ 2010-109692

(51) Int. Cl.
*H03K 3/00*        (2006.01)
(52) U.S. Cl. .......................... 327/110; 327/424; 327/588
(58) Field of Classification Search .......... 327/109–110, 327/387–388, 423–424, 588
See application file for complete search history.

(56) References Cited

U.S. PATENT DOCUMENTS 6,181,186 B1    1/2001  Itoh et al.
7,714,624 B2 *  5/2010  Takasu et al. ................. 327/110

FOREIGN PATENT DOCUMENTS

JP       2000-12853 A     1/2000

OTHER PUBLICATIONS

"Intelligent Power MOSFET", Fuji Times, 2008, pp. 410-414, vol. 81, No. 6.

* cited by examiner

*Primary Examiner* — An Luu
(74) *Attorney, Agent, or Firm* — Sughrue Mion, PLLC

(57) ABSTRACT

Malfunction attributable to an induced electromotive force such as a back electromotive force or a regenerative braking force of an inductive load in a load driving device is prevented. When an on-state current flows in an output transistor, a second transistor applies a supply voltage applied to a source of the output transistor to a back gate of the first transistor. On the other hand, when a negative current flows in the output transistor in a direction opposite to that of the on-state current, the second transistor applies a supply voltage applied to a drain of the output transistor to the back gate of the first transistor.

10 Claims, 20 Drawing Sheets

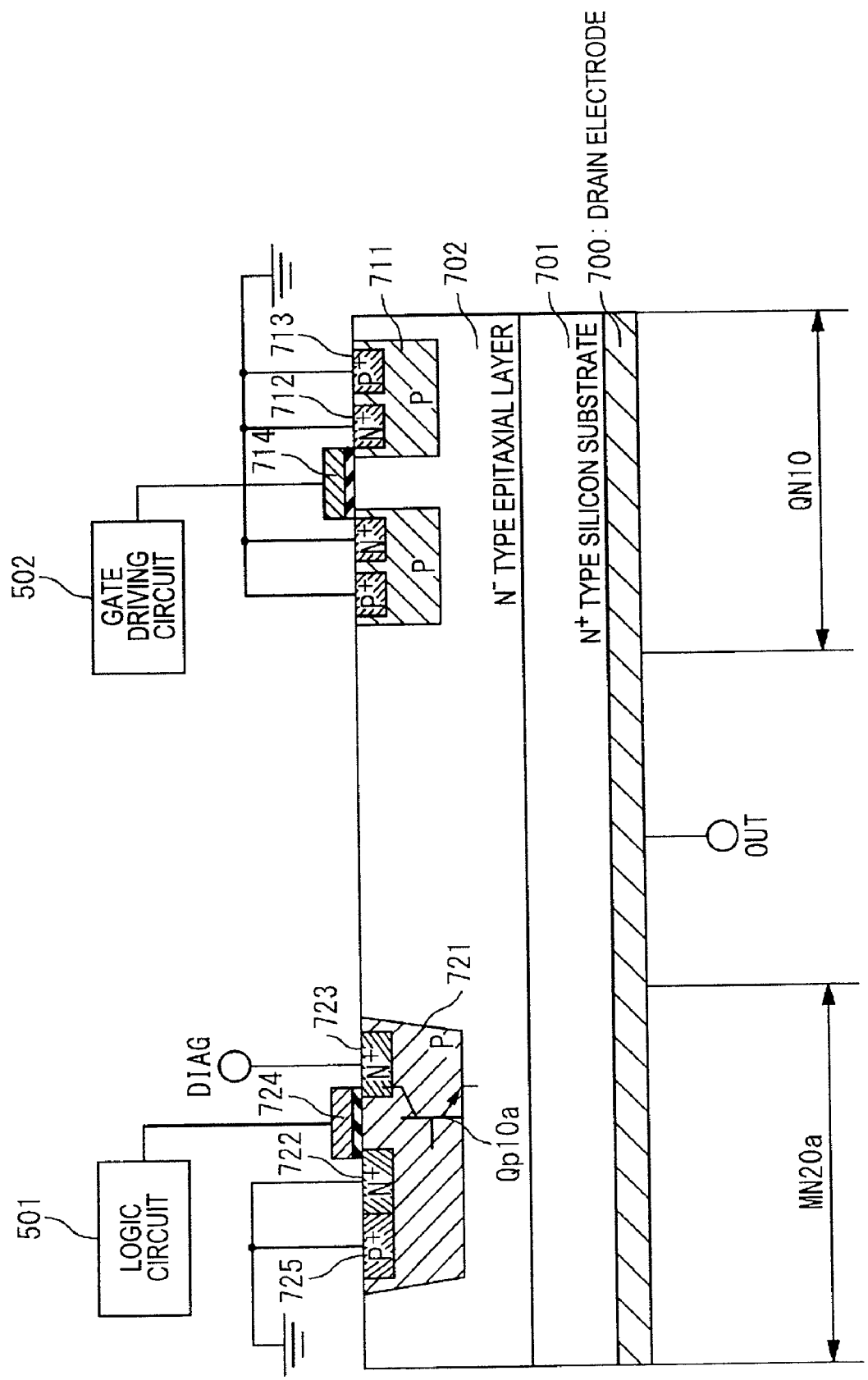

US 8,390,340 B2

LOAD DRIVING DEVICE

CROSS-REFERENCE TO RELATED APPLICATIONS

The disclosure of Japanese Patent Application No. 2010-109692 filed on May 11, 2010 including the specification, drawings and abstract is incorporated herein by reference in its entirety.

BACKGROUND

The present invention relates to a load driving device and a load driving method, and more particularly to a load driving circuit and a load driving method, which drive an inductive load with the use of a power transistor with a vertical structure, having an output controlled by a transistor with a horizontal structure.

As a load driving apparatus for use in a vehicle, a low side switch is used to drive an inductive load such as a solenoid coil or a relay switch. A switch provided in the low side switch is connected to a low side, and the load is connected to a high side. This low side switch may be provided with a disconnection detection circuit for detecting a disconnection of the load, an overcurrent protection circuit for protecting the switch or the load from an overcurrent generated when the load connection is in an abnormal state such as a short circuit, or an over-temperature protection circuit.

A power MOSFET (metal oxide semiconductor field effect transistor) with a vertical structure, which can reduce a power loss is used in a switch transistor provided in the low side switch. A MOSFET or a polysilicon resistor with a horizontal structure is used in a control circuit for the disconnection detection circuit or the protection circuit.

The low side switch of this type is disclosed by, for example, "Intelligent Power MOSFET", Fuji Times, vol. 81, No. 6, 2008 (Non-patent document 1), and Japanese Unexamined Patent Publication No. 2000-12853 (Patent document 1).

SUMMARY

However, as a result of deep study by the inventors, the following matter to be improved has been found. In the load driving device in which the vertical power MOSFET and the control circuit are disposed in the same chip, when the switch transistor switches from on to off, electricity is supplied from a source of the vertical power MOSFET to a drain thereof by the aid of an induced electromotive force of the inductive load. In this situation, a p-n junction in the control circuit is biased in a forward direction. This may lead to a case in which a parasitic transistor formed within the control circuit operates, and the control circuit malfunctions.

Hereinafter, the malfunction of the control circuit due to the induced electromotive force will be described in detail with reference to FIGS. 1 to 7.

FIG. 1 is a circuit diagram illustrating a partial configuration of a load driving apparatus 5 of the related art. The load driving apparatus 5 in the related art includes a load driving device 500, a CPU 505, an inductive load 53, a first power supply 51, a second power supply 52, a third power supply 54, a pull-up resistor Rdiag, an input terminal IN, an output terminal OUT, a ground terminal GND, and a self-diagnostic output terminal DIAG.

The load driving device 500 includes a logic circuit 501, a gate driving circuit 502, an overheat detection circuit 503, an overcurrent detection circuit 504, an output transistor QN10, n-channel transistors MN20a, MN20b, MN30, a current source I10, diodes D10, D20, and resistors R501, R502.

In the load driving device 500, on/off operation of the output transistor QN10 is controlled according to a signal from the CPU 505, and a power supply (current supply) to the inductive load 53 is controlled. Specifically, when an input signal IN is high level, the output transistor QN10 turns on, and when the input signal IN is low level, the output transistor QN10 turns off. Also, when abnormality such as overcurrent or over-temperature occurs in a state where the output transistor QN10 is on, a signal that allows the re-channel transistor MN30 to turn on is output from the logic circuit 501, and the output transistor QN10 turns off.

A signal corresponding to a state of the output transistor QN10 is output to the self-diagnostic output terminal DIAG, and a state of the load driving device 500 is notified to the CPU 505. FIG. 2 is an example of a timing chart of an expected self-diagnostic output signal. In FIG. 2, a voltage across the input terminal IN is denoted by VIN, a load current is Iout, a voltage across the output terminal OUT is Vout, a voltage across the self-diagnostic output terminal DIAG is Vdiag. An output of a truth value shown in FIG. 2 is output to the self-diagnostic output terminal DIAG whereby the CPU 505 determines a state of the load driving device 500 so as to determine subsequent control on the load driving device 500.

FIG. 3 is a diagram illustrating an example of a configuration of the load driving apparatus 5 of the related art that drives the inductive load 53 (exemplified by a motor). In this example, in order to control positive rotation and negative rotation of the inductive load 53, a load driving devices are connected with an H-bridge configuration. That is, two load driving devices are connected to each of a node A and a node B which are connection terminals with the inductive load 53, at the high side and the low side. In the example of FIG. 3, load driving devices 600-1 and 600-2 each having a p-channel output transistor are used at the high side, and load driving devices 500-1 and 500-2 each having an n-channel output transistor are used at the low side. In this example, each of the load driving devices 500-1 and 500-2 is configured as illustrated in FIG. 1, and communicates a state of each of the load driving devices 500-1 and 500-2 to the CPU 505 through the self-diagnostic output terminal DIAG.

A method of driving the inductive load 53 illustrated in FIG. 3 is illustrated in FIGS. 4A to 4C. In FIGS. 3 and 4A to 4C, the output transistors of the load driving devices 500-1 and 500-2 are denoted by Q1 and Q2, and the output transistors of the load driving devices 600-1 and 600-2 are denoted by Q3 and Q4. FIG. 4A illustrates a state of the load driving apparatus when the inductive load 53 is energized. When the motor transits from an energized state to a disconnected state, there are cases in which the motor transits to a state illustrated in FIG. 4B, or the motor transits to a state illustrated in FIG. 4C. When the motor transits from the energized state illustrated in FIG. 4A to the states of FIG. 4B or 4C, a current (negative current) in a direction opposite to an on-state current may flow in an output transistor of the load driving device due to an induced electromotive force such as a back electromotive force or a regenerative braking force developed by the inductive load 53. For example, when attention is paid to the output transistor Q1, the negative current (called "regenerative current") may flow from a source (GND) of the output transistor Q1 to a drain thereof (OUT: node A) in the state of FIG. 4B.

For example, in the load driving device 500 at the low side, as illustrated in FIG. 5, the output transistor QN10 and the circuit that controls the output transistor QN10 (in this example, the n-channel transistors MN20a) are formed in the same chip (in the same semiconductor substrate). That is, the output transistor QN10 and the n-channel transistor MN20a are formed in an n+ type silicon substrate 701 and an n− type epitaxial layer 702.

In more detail, the output transistor QN10 is a transistor with a vertical structure in which the n+ type silicon substrate 701 on a rear surface of which a drain electrode 700 is deposited, and the n− type epitaxial layer 702 are formed as drains. A p type base region 711 that forms a back gate region of the output transistor QN10 is formed in an upper portion of the n− type epitaxial layer 702. An n+ type diffusion region 712 that functions as a source region and a p+ type diffusion region 713 that functions as a substrate terminal for connecting the back gate region and the ground terminal GND are formed within the p type base region 711. Also, a gate electrode 714 connected to the gate driving circuit 502 is formed on a gate insulating layer.

Further, the n-channel transistor MN20a is a transistor with a horizontal structure, which is formed in a p type well region 721 formed within the n− type epitaxial layer 702. In an upper portion of the p type well region 721 are formed an n+ type diffusion region 722 that functions as a source of the re-channel transistor MN20a, an n+ type diffusion region 723 that functions as a drain, and a p+ type diffusion region 725 that functions as a substrate terminal which connects the back gate region (the p type well region 721) and the ground terminal GND. Also, a gate electrode 724 to which a control signal is supplied from the logic circuit 501 is formed across from the p type well region 721 via a gate insulating layer.

In this example, when a current (a current in a direction opposite to an on-state current) flows into the vertical output transistor QN10 from the source of to the drain thereof, a vertical parasitic bipolar transistor Qp10a provided in the horizontal n-channel transistor MN20a that functions as the control circuit operates, and the control circuit malfunctions. In the example illustrated in FIG. 5, the parasitic bipolar transistor Qp10a operates with the n+ type diffusion region 723, the p type well region 721, and the n− type epitaxial layer 702 (and the n+ type silicon substrate 701) as a collector, a base, and an emitter thereof, respectively. That is, when a current flows into the output transistor QN10 from the source to the drain thereof, as illustrated in FIG. 6, the parasitic NPN bipolar transistor Qp10a operates with the collector connected to the drain of the n-channel transistors MN20a and the self-diagnostic output terminal DIAG, the emitter connected to the drain of the output transistor QN10 by sharing the n− type epitaxial layer 702 and the n+ type silicon substrate 701, and the base connected to the back gate of the n-channel transistors MN20a. As a result, a false signal shown in FIG. 7A is output to the self-diagnostic output terminal DIAG. In an example shown in FIG. 7A, a self-diagnostic output voltage Vdiag1 is inverted at a time T3 when a negative current flows in the output transistor QN1.

Likewise, a parasitic NPN bipolar transistor Qp10b in the n-channel transistors MN20b that functions as the control circuit operates when a current flows into the output transistor QN10 from the source to the drain thereof, to thereby output a false signal to the self-diagnostic output terminal DIAG.

The malfunction caused by the induced electromotive force of the inductive load also occurs in the high side switch. Although the detailed description will be omitted, a p-channel transistor having the horizontal structure is formed, as a control circuit for controlling the p-channel output transistor having the vertical structure, on the same substrate together with the output transistor. In this case, when the motor transits to the state shown in FIG. 4C, the parasitic PNP transistor in the load control circuit may operate to malfunction the output transistor.

In the state shown in FIG. 4C, the output transistor Q4 is controlled to be on-state so as to reduce a power loss attributable to the negative current. However, when the output transistor Q4 turns off due to the above-mentioned malfunction, the negative current flows through a body diode of the output transistor Q4, resulting in an increase of the power loss. In an example shown in FIG. 7B, a potential of the NODE B is inverted at a time T3 when the negative current flows in the output transistor Q4.

From the above viewpoint, a load driving device is demanded which does not malfunction due to the induced electromotive force of the inductive load.

The present invention seeks to solve or to improve one or more of the above problems and applies the following means. In the description of technical matters that configure the means, in order to clarify a correspondence relationship between description of "what is claimed is" and description of "detailed description", reference numerals and symbols used in "detailed description" are added. However, the added reference numerals and symbols must not be used for restrictively interpreting the technical scope of the invention described in "what is claimed is".

According to an aspect of the present invention, there is provided a load driving device including: an output transistor (QN1, QP1) having a vertical structure which controls supply of current to an inductive load (3) according to a gate voltage; a first transistor (MN2, NM3, MP3) having a horizontal structure which controls a magnitude of a gate voltage across the output transistor (QN1, QP1); and a second transistor (MN4a, MN4b, MN4c, MP4) having a horizontal structure which controls the voltage to a back gate of the first transistor (MN2, NM3, MP3). The output transistor, the first transistor, and the second transistor are transistors of the same conduction type formed in the same substrate (201, 401). The output transistor (QN1) has a drain connected to a first power supply (1) through an inductive load (3), and a source connected to a second power supply (2) that applies a supply voltage different in the first power supply (1). Or the output transistor (QP1) has a drain connected to a first power supply (2) through an inductive load (3), and a source connected to a second power supply (1) that applies a supply voltage different in the first power supply (2). When an on-state current flows in the output transistor (QN1, QP1), the second transistor (MN4a, MN4b, MN4c, MP4) applies the supply voltage applied to the source of the output transistor (QN1, QP1) to the back gate of the first transistor (MN2, NM3, MP3). On the other hand, when a negative current in a direction opposite to that of the on-state current flows in the output transistor (QN1, QP1), the second transistor (MN4a, MN4b, MN4c, MP4) applies the supply voltage applied to the drain of the output transistor (QN1, QP1) to the back gate of the first transistor (MN2, NM3, MP3).

With the above configuration, a voltage between a base and an emitter of a parasitic bipolar transistor formed in the first transistor (MN2, NM3, MP3) become the same potential, and the parasitic bipolar transistor does not operate so that malfunction of the first transistor (MN2, NM3, MP3) can be prevented.

According to the present invention, the load driving device can be prevented from malfunctioning due to an induced electromotive force of an inductive load.

BRIEF DESCRIPTION OF THE DRAWINGS

FIG. 5 is a cross-sectional view illustrating a partial transistor structure of the load driving device of the related art;

DETAILED DESCRIPTION

Figure 1:
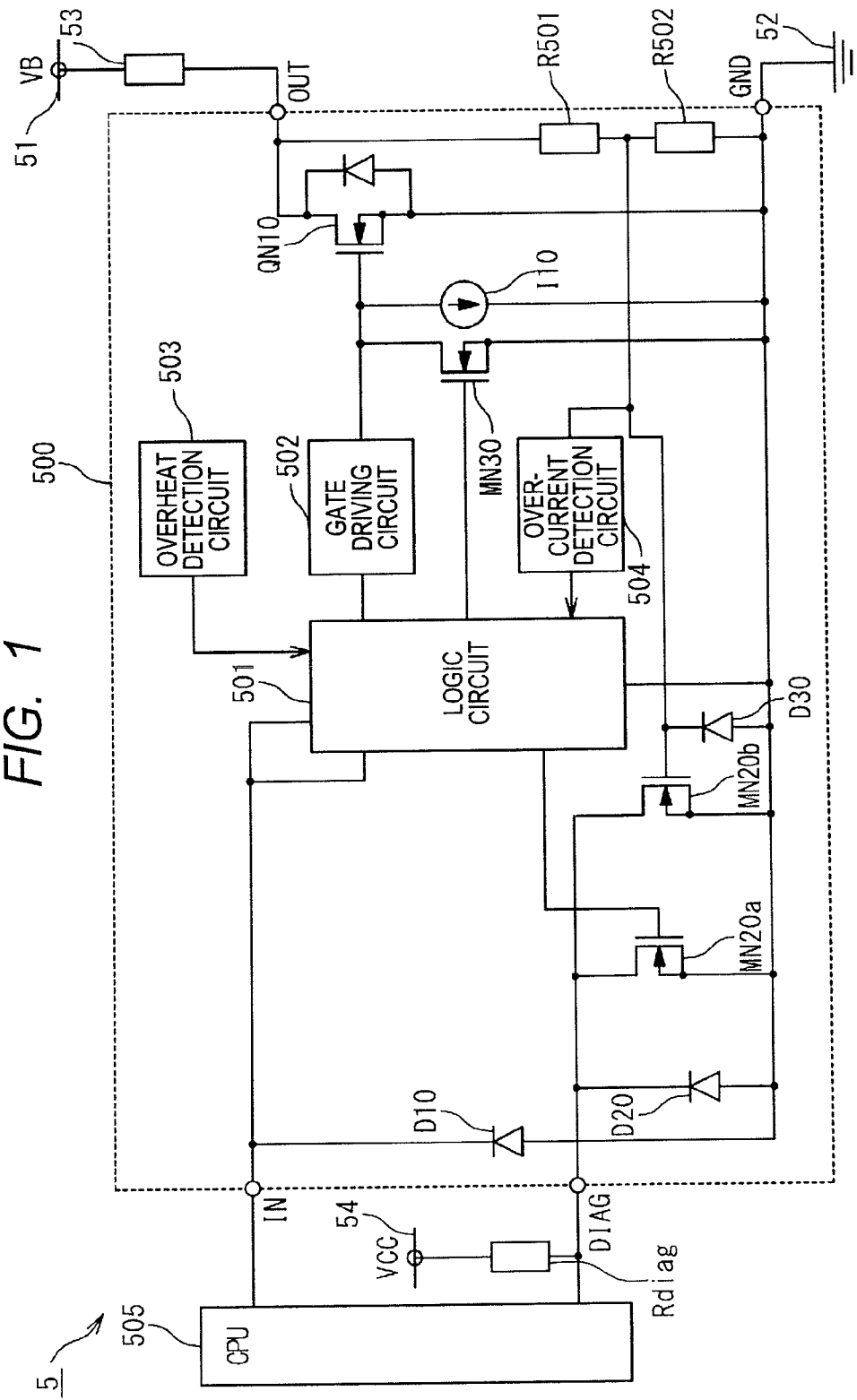
FIG. 1 is a circuit diagram illustrating a configuration of a load driving device of the related art.

Hereinafter, embodiments of the present invention will be described with reference to the accompanying drawings. In the drawings, identical or similar reference numerals denote identical, similar or equivalent components. In the following description, a load driving device that drives a motor as an inductive load is exemplified, and its configuration and operation will be described.

(Overall Configuration of Load Driving Device)

Figure 8:
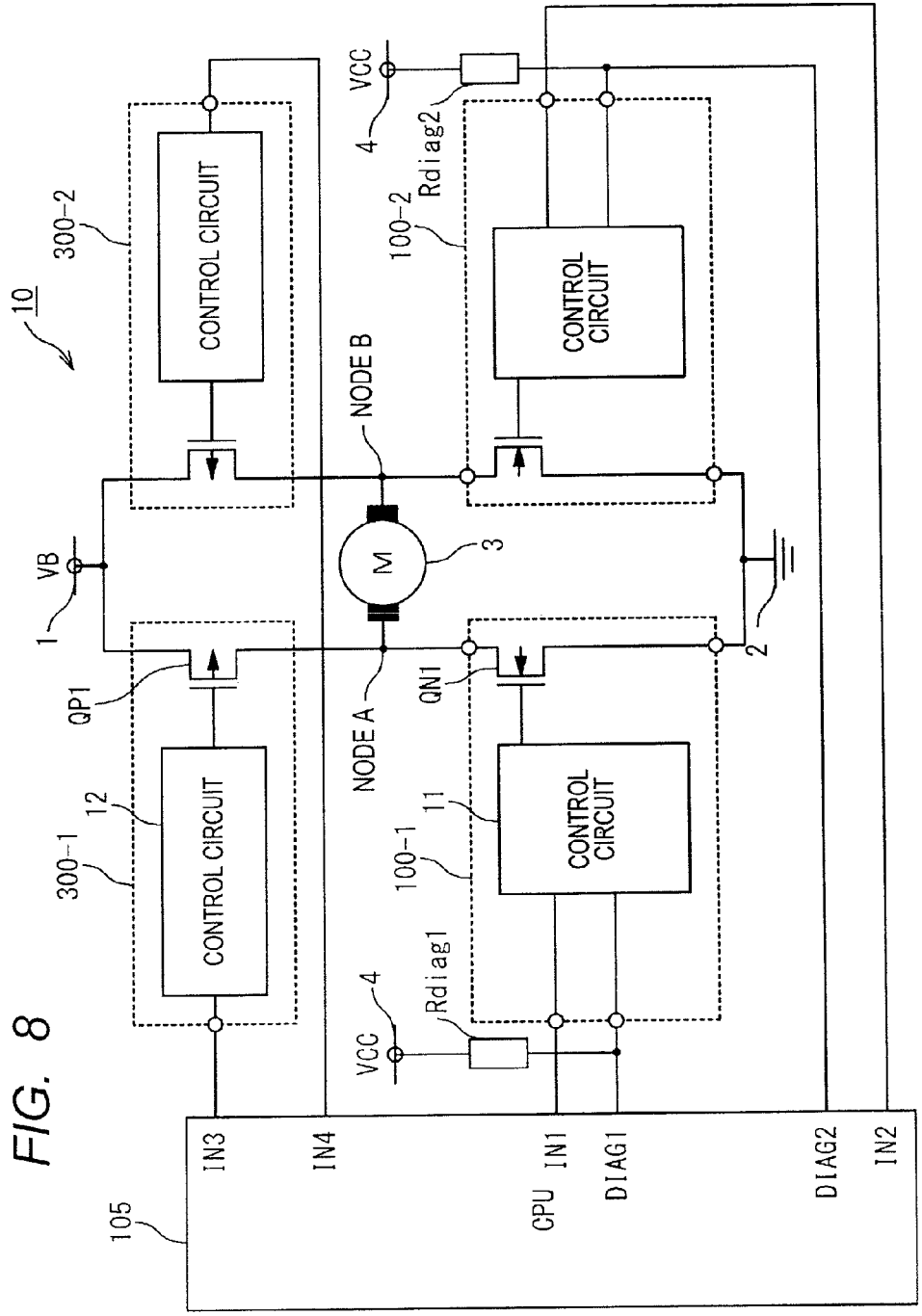
FIG. 8 is a diagram illustrating an example of a configuration of a load driving apparatus according to the present invention.

FIG. 8 is a diagram illustrating an example of a configuration of a load driving apparatus 10 according to the present invention. Referring to FIG. 8, an example of the entire configuration of a load driving apparatus 10 according to the present invention will be described. The load driving apparatus 10 includes load driving devices 100-1, 100-2, 300-1, and 300-2 configuring an H-bridge; a CPU 105; a first power supply 1 that applies a first supply voltage (for example, a power supply VB); a second power supply 2 that applies a second supply voltage (for example, a ground voltage GND); a third power supply 4 that applies a third supply voltage (for example, supply voltage VCC); and pull-up resistors Rdiag1 and Rdiag2.

In this example, for example, in order to control positive rotation and negative rotation of a motor (inductive load 3), the load driving devices 100-1, 100-2, 300-1 and 300-2 are connected with an H-bridge configuration. That is, two load driving devices are connected to each of a node A and a node B which are connection terminals with the inductive load 3, at the high side and the low side. In the example of FIG. 8, load driving devices 300-1 and 300-2 each having a p-channel output transistor QP1 are disposed at the high side, and load driving devices 100-1 and 100-2 each having an n-channel output transistor QN1 are disposed at the low side. The inductive load 3 to be driven by the load driving apparatus 10 is exemplified by a motor, a solenoid coil, or a relay switch that generates an induced electromotive force due to its rotation movement.

In detail, the load driving devices 100-1 and 100-2 configure a low side switch that is connected between the nodes A, B of the inductive load 3 and the second power supply 2, and controls a current which flows from the inductive load 3 to the second power supply 2. Likewise, the load driving devices 300-1 and 300-2 configure a high side switch that is connected between the nodes A, B of the inductive load 3 and the first power supply 1, respectively, and controls a current which flows from the first power supply 1 to the inductive load 3.

Figure 2:
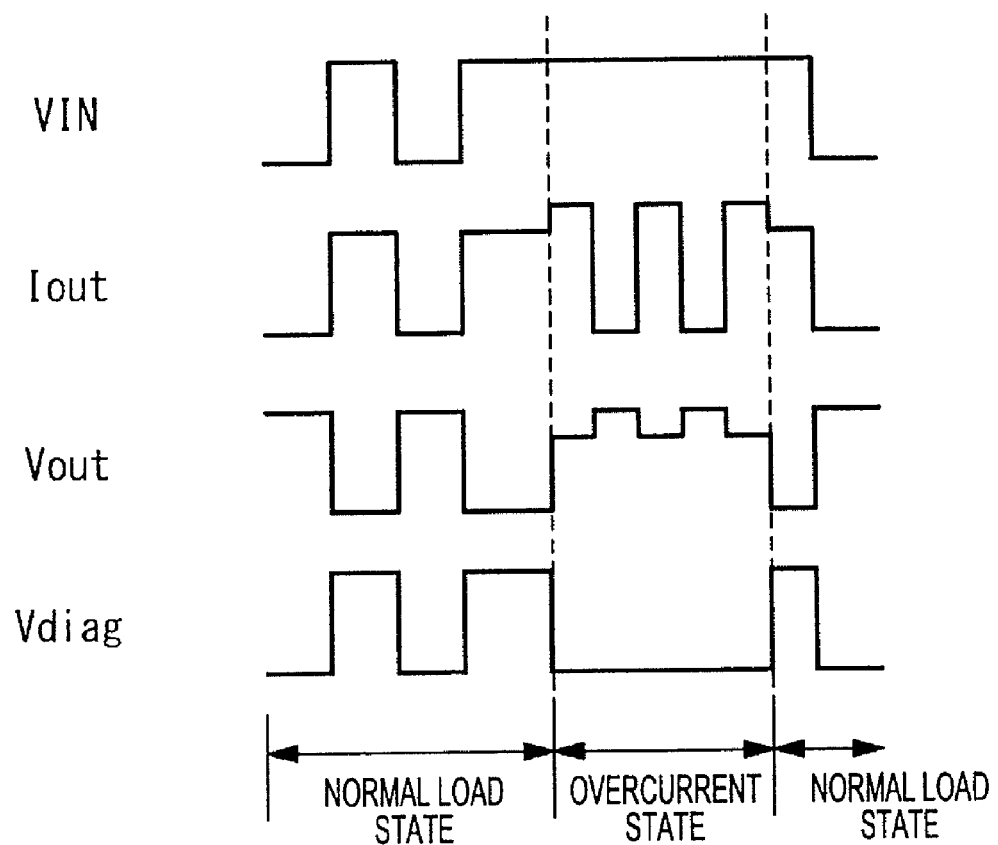
FIG. 2 is a timing chart of an example of an expected self-diagnostic output signal.
Figure 3:
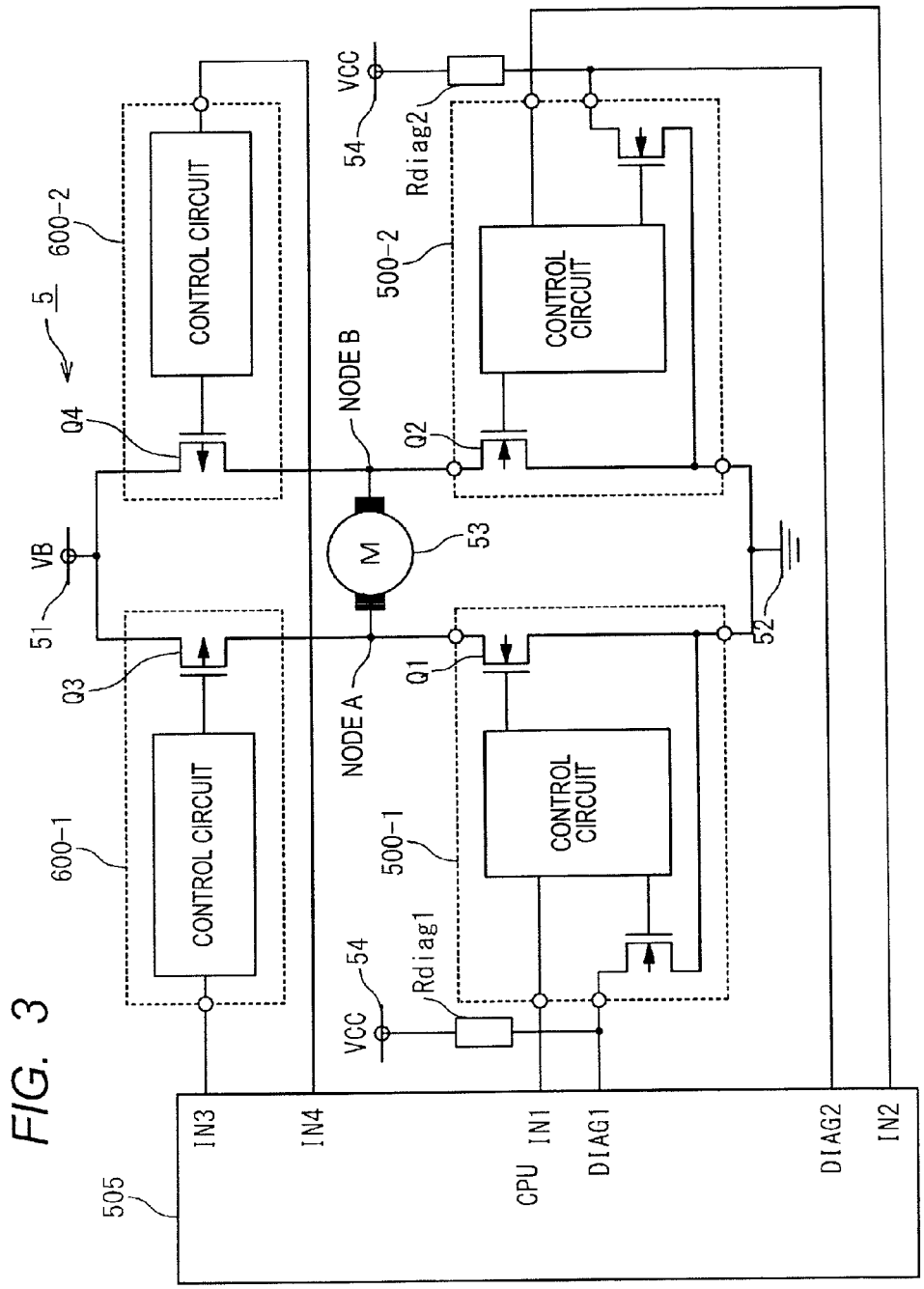
FIG. 3 is a circuit diagram illustrating a configuration of a load driving apparatus of the related art.

Each of the load driving devices 100-1 and 100-2 includes an output transistor QN1 and a control circuit 11. The output transistor QN1 of the load driving device 100-1 controls an electric connection between the node A of the inductive load 3 and the second power supply 2 according to a control signal from the control circuit 11. The control circuit 11 of the load driving device 100-1 conducts the switching control of the output transistor QN1 according to an input signal IN1 from the CPU 105. The control circuit 11 also outputs an operating state and an environmental situation of the load driving device 100-1 to the CPU 105 through the self-diagnostic output terminal DIAG1. Likewise, the output transistor QN1 of the load driving device 100-2 controls an electric connection between the node B of the inductive load 3 and the second power supply 2 according to a control signal from the control circuit 11. The control circuit 11 of the load driving device 100-2 conducts the switching control of the output transistor QN1 according to an input signal IN2 from the CPU 105. The control circuit 11 also outputs an operating state and an environmental situation of the load driving device 100-2 to the CPU 105 through the self-diagnostic output terminal DIAG2. When truth values (expected values) shown in FIG. 2 are output to the self-diagnostic output terminals DIAG1 and DIAG2, the CPU 105 can determine a correct status of the load driving devices 100-1 and 100-2 so as to determine subsequent control on the load driving devices 100-1 and 100-2.

Each of the load driving devices 300-1 and 300-2 includes an output transistor QP1 and a control circuit 12. The output transistor QP1 of the load driving device 300-1 controls an electric connection between the node A of the inductive load 3 and the first power supply 1 according to a control signal from the control circuit 12. The control circuit 12 of the load driving device 300-1 conducts the switching control of the output transistor QP1 according to an input signal IN3 from the CPU 105. Likewise, the output transistor QP1 of the load driving device 300-2 controls an electric connection between the node B of the inductive load 3 and the first power supply 1 according to a control signal from the control circuit 12. The control circuit 12 of the load driving device 300-2 conducts the switching control of the output transistor QP1 according to an input signal IN4 from the CPU 105.

(Load Driving Device)

Hereinafter, a detailed configuration and operation of the load driving apparatus illustrated in FIG. 8 will be described.

1. First Embodiment

A description will be given in detail of a configuration and an operation of the load driving device 100 according to a first embodiment of the present invention with reference to FIGS. 9 to 11.

Figure 9:
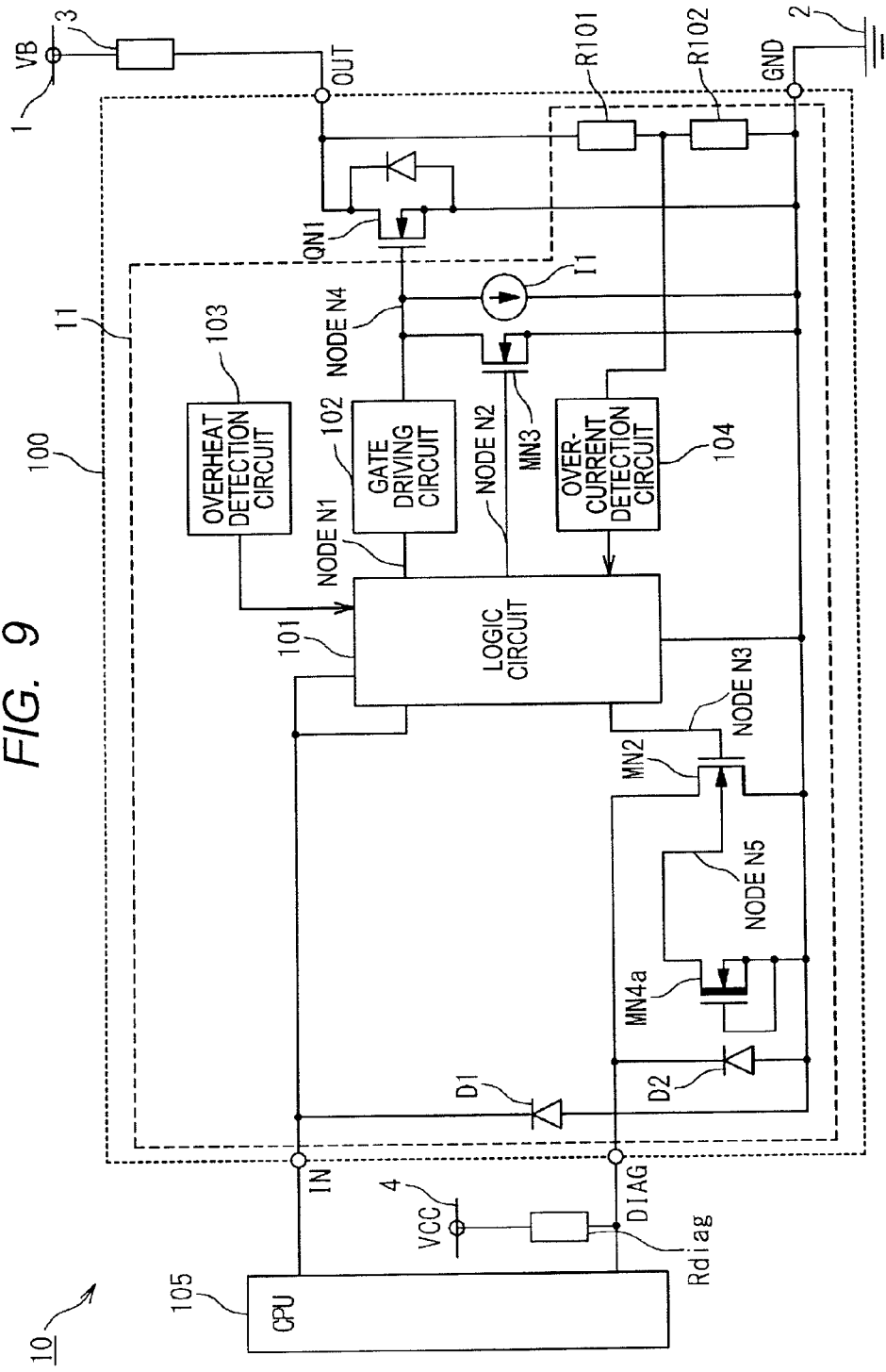
FIG. 9 is a circuit diagram illustrating a configuration of a load driving device according to a first embodiment of the present invention.

FIG. 9 is a circuit diagram illustrating a partial configuration of the load driving apparatus 10 according to the first embodiment of the present invention. The load driving apparatus 10 according to the first embodiment includes a load driving device 100, a CPU 105, a first power supply 1, a second power supply 2, a third power supply 4, a pull-up resistor Rdiag, an input terminal IN, an output terminal OUT, a ground terminal GND, and a self-diagnostic output terminal DIAG.

The load driving device 100 according to the first embodiment includes a logic circuit 101, a gate driving circuit 102, an overheat detection circuit 103, an overcurrent detection circuit 104, an output transistor QN1, n-channel transistors MN2, MN3 and MN4a, a current source I1, diodes D1, D2, and resistors R101, R102.

The output terminal OUT is connected to the first power supply 1 through the inductive load 3. The ground terminal GND is connected to the second power supply 2. The input terminal IN and the self-diagnostic output terminal DIAG are connected to the CPU 105. Also, the self-diagnostic output terminal DIAG is connected to the third power supply 4 (power supply VCC) through the pull-up resistor Rdiag. In this embodiment, the first power supply 1 applies a battery voltage VB, the second power supply 2 applies the ground voltage GND, and the third power supply 4 applies a power supply VCC of 5V, for example.

The diode D1 is disposed between the input terminal IN and the ground terminal GND, and the diode D2 for protection is disposed between the self-diagnostic output terminal DIAG and the ground terminal GND. In more detail, the diode D1 has an anode connected to the ground terminal GND, and a cathode connected to the input terminal IN. Also, the diode D2 has an anode connected to the ground terminal GND, and a cathode connected to the self-diagnostic output terminal DIAG.

The logic circuit 101 outputs, to the nodes N1, N2, and N3, a control signal corresponding to an input signal from the input terminal IN, an overheat detection signal from the overheat detection circuit 103, or an overcurrent detection signal from the overcurrent detection circuit 104. The control signal output to the node N1 is input to the gate driving circuit 102. The control signal output to the node N2 is input to a gate of the n-channel transistor MN3. The control signal output to the node N3 is input to a gate of the n-channel transistor MN2.

The gate driving circuit 102 outputs a signal having a signal level (high level or low level) corresponding to the control signal from the node N1 (logic circuit 101) to a gate (node N4) of the output transistor QN1 to control the on/off operation of the output transistor QN1.

The output transistor QN1 has a drain connected to the output terminal OUT, a source connected to the ground terminal GND, and a gate connected to the gate driving circuit 102 through the node N4. The output transistor QN1 is preferably formed of a power MOSFET.

The n-channel transistors MN3 is connected between a gate (node N4) and a source (ground terminal GND) of the output transistor QN1. In more detail, the n-channel transistor MN3 has a drain connected to the node N4, a source connected to the ground terminal GND, and a gate connected to the node N2 which is one of output terminals of the logic circuit 101.

The logic circuit 101 outputs the control signal for turning on the n-channel transistor MN3 to the node N2 upon receiving an overheat detection signal indicating that the load driving device 100 (or the load driving apparatus 10) is in an over-temperature state, or upon receiving an overcurrent detection signal indicating that an overcurrent flows in the inductive load 3. As a result, the n-channel transistor MN3 operates to turn off the output transistor QN1 upon detecting the abnormality of the load driving apparatus 10 such as the over-temperature state or the overcurrent state. Also, when the load driving apparatus 10 is in a normal state, the re-channel transistor MN3 turns off, and the output transistor QN1 controls a current that flows in the inductive load 3 by operation corresponding to the control signal from the logic circuit 101.

The overheat detection circuit 103 monitors a temperature (or an ambient temperature) of the load driving device 100, and outputs an over-temperature detection signal indicative of abnormality to the logic circuit 101 when a temperature of the load driving device 100 exceeds a given temperature.

The overcurrent detection circuit 104 monitors a divided voltage obtained by the voltage divider resistors R101 and R102 which are connected between the drain and the source of the output transistor QN1, to thereby detect whether there is an abnormality between the drain and the source of the output transistor QN1, or not. In more detail, one end of the resistor R101 is connected to a drain terminal of the output transistor QN1, and the other end thereof is connected to one end of the resistor R102. The other end of the resistor R102 is connected to a source terminal of the output transistor QN1. A connection point between the resistors R101 and R102 is commonly connected to the overcurrent detection circuit 104. The divided voltage of the voltage between the drain and the source of the output transistor QN1 is input to the overcurrent detection circuit 104 through the connection point.

The overcurrent detection circuit 104 monitors a voltage between the drain and the source of the output transistor QN1 to monitor a current that flows in the output transistor QN1. For example, when the voltage between the drain and the source of the output transistor QN1 is larger than a given voltage, the overcurrent detection circuit 104 determines that an overcurrent flows in the output transistor QN1, and outputs the overcurrent detection signal indicative of abnormality to the logic circuit 101.

When the overheat detection circuit 103 or the overcurrent detection circuit 104 outputs the detection signal indicative of abnormality, the logic circuit 101 outputs a signal of high level to the node N2, and turns on the re-channel transistor MN3.

The current source I1 is connected between the gate (node N4) and the source (ground terminal GND) of the output transistor QN1.

The n-channel transistor MN2 has a drain connected to the self-diagnostic output terminal DIAG, a source connected to the ground terminal GND, and a gate connected to the node N3. Also, the back gate (substrate terminal) of the n-channel transistor MN2 is connected with the drain of the n-channel transistor MN4a. The n-channel transistor MN2 has an output of an open drain configuration. In this embodiment, the drain of the n-channel transistor MN2 is connected to the third power supply 4 (supply voltage VCC) through the pull-up resistor Rdiag.

The n-channel transistor MN4a has a drain connected to the back gate (substrate terminal) of the n-channel transistors MN2 through a node N5, and a source, a gate, and a back gate (substrate terminal) connected commonly to the ground terminal GND. Also, the n-channel transistor MN4a is a depletion type transistor, and is in normal on-state. For that reason, a potential of the ground terminal GND, to which a second power supply voltage (in this example, the ground voltage GND) is applied, is applied to the back gate (substrate terminal) of the n-channel transistor MN2 through the n-channel transistor MN4a. Further, the source of the output transistor QN1 is connected to the ground terminal GND, the same voltage as the supply voltage applied to the source of the output transistor QN1 is normally applied to the back gate (substrate terminal) of the n-channel transistor MN2.

Figure 10:
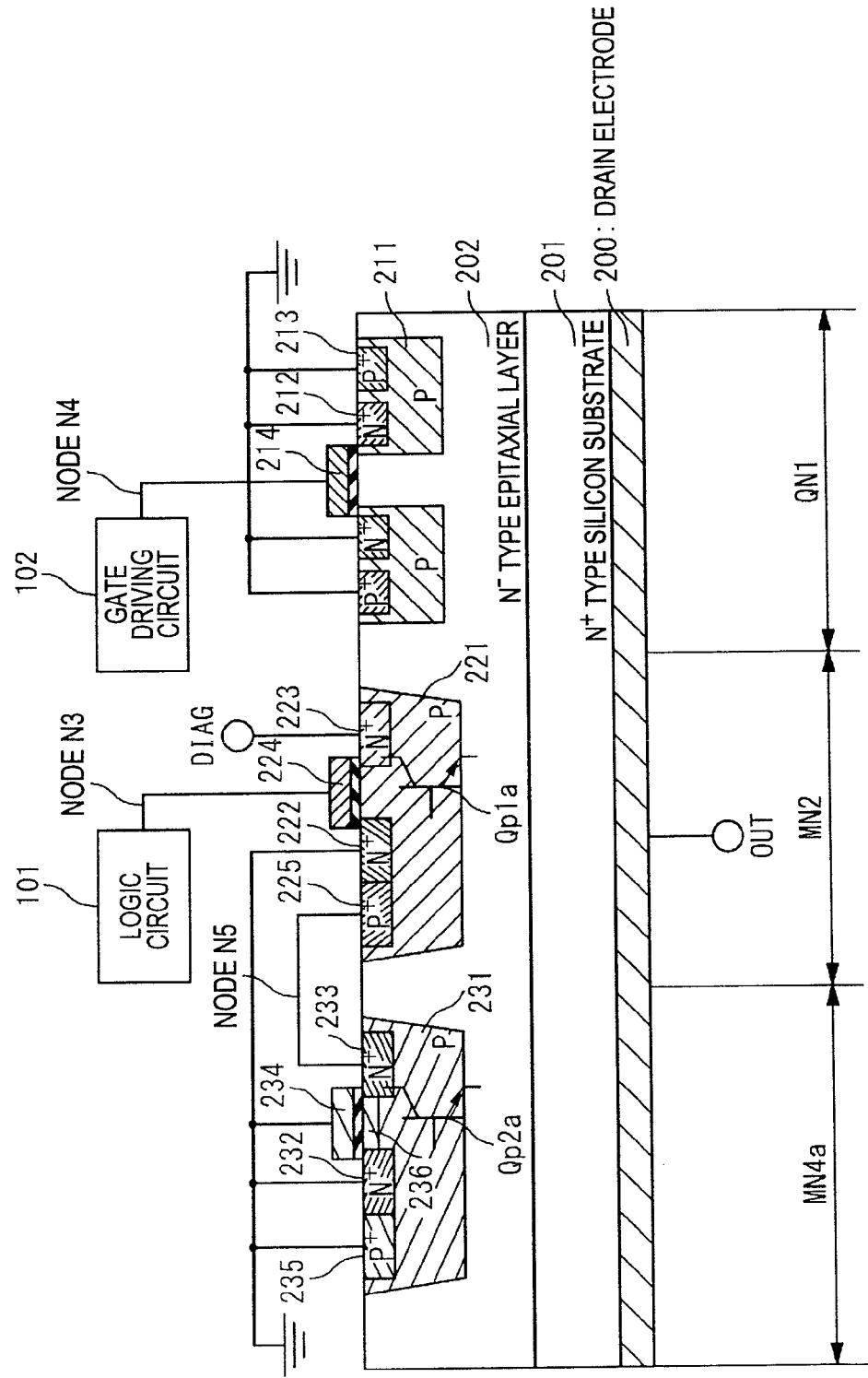
FIG. 10 is a cross-sectional view illustrating a partial transistor structure of a load driving device according to the first embodiment.

FIG. 10 is a cross-sectional view illustrating a partial transistor structure of the load driving device 100 according to the first embodiment.

Referring to FIG. 10, in the load driving device 100, the output transistor QN1 and a transistor that controls the output transistor QN1 (in this example, the n-channel transistors MN2 and MN4a) are formed in the same chip (in the same semiconductor substrate). That is, the output transistor QN1 and the n-channel transistors MN2, MN4a are formed in the same $n^-$ type epitaxial layer 202 and the same $n^+$ type silicon substrate 201. In this example, the $n^-$ type epitaxial layer 202 is formed on the $n^+$ type silicon substrate 201, and a drain electrode 200 is deposited on a rear surface of the $n^+$ type silicon substrate 201 opposite from the $n^-$ type epitaxial layer 202.

The output transistor QN1 is a transistor with a vertical structure having the $n^+$ type silicon substrate 201 on which the drain electrode 200 is deposited, and the $n^-$ type epitaxial layer 202 as a drain. A p type base region 211 forming a back gate region of the output transistor QN1 is formed in an upper portion of the $n^-$ type epitaxial layer 202. Within the p type base region 211 are formed an $n^+$ type diffusion region 212 functioning as a source region, and a $p^+$ type diffusion region 213 functioning as a substrate terminal that connects the back gate region and the ground terminal GND. Also, a gate electrode 214 connected to the gate driving circuit 102 through the node N4 is formed on a gate insulating layer. Further, the drain electrode 200 is connected with the output terminal OUT, and the $n^+$ type diffusion region 212 is connected to the ground terminal GND.

On the other hand, p type well regions 221 and 231 for forming the n-channel transistors MN2 and MN4a for a control circuit are formed in the $n^-$ type epitaxial layer 202, independently. The n-channel transistor MN2 having the horizontal structure is formed in the p type well region 221, and the n-channel transistor MN4a having the horizontal structure is formed in the p type well region 231.

In more detail, in the p type well region 221 are formed an $n^+$ type diffusion region 222 functioning as the source of the n-channel transistor MN2, an $n^+$ type diffusion region 223 functioning as the drain thereof, and a $p^+$ type diffusion region 225 functioning as the substrate terminal that connects the back gate region (the p type well region 221) and the node N5. Also, on the p type well region 221 is formed a gate electrode 224 via a gate insulating layer which is connected to the logic circuit 101 through the node N3. Further, the $n^+$ type diffusion region (source) 222 is connected to the ground terminal GND, and the $n^+$ type diffusion region (drain) 223 is connected to the self-diagnostic output terminal DIAG.

In the p type well region 231 are formed an $n^+$ type diffusion region 232 functioning as the source of the n-channel transistor MN4a, a $p^+$ type diffusion region 235 functioning as the substrate terminal that connects the back gate region (p type well region 231) and the ground terminal GND, and an $n^+$ type diffusion region 233 functioning as the drain thereof. Also, a gate electrode 234 connected to the ground terminal GND is formed on the p type well region 231 via a gate insulating layer, and an $n^+$ type inversion layer 236 is formed in a channel region under the gate electrode 234. Further, the $n^+$ type diffusion region (source) 232 is connected to the ground terminal GND, and the $n^+$ type diffusion region (drain) 233 is connected to the node N5.

With the above configuration, in this embodiment, the back gate voltage of the n-channel transistor MN2 can be controlled by a drain voltage across the depletion type n-channel transistor MN4a.

As illustrated in FIG. 10, parasitic NPN bipolar transistors Qp1a and Qp2a are formed in the n-channel transistors MN2 and MN4a, respectively. In more detail, there are formed the parasitic NPN bipolar transistor Qp1a having the $n^+$ type diffusion region 223, the p type well region 221, and the $n^-$ type epitaxial layer 202 (and the $n^+$ type silicon substrate 201) as a collector, a base, and an emitter thereof, respectively, and the parasitic NPN bipolar transistor Qp2a having the $n^+$ type diffusion region 233, the p type well region 231, and the $n^-$ type epitaxial layer 202 (and the $n^+$ type silicon substrate 201) as a collector, a base, and an emitter thereof, respectively.

Figure 11:
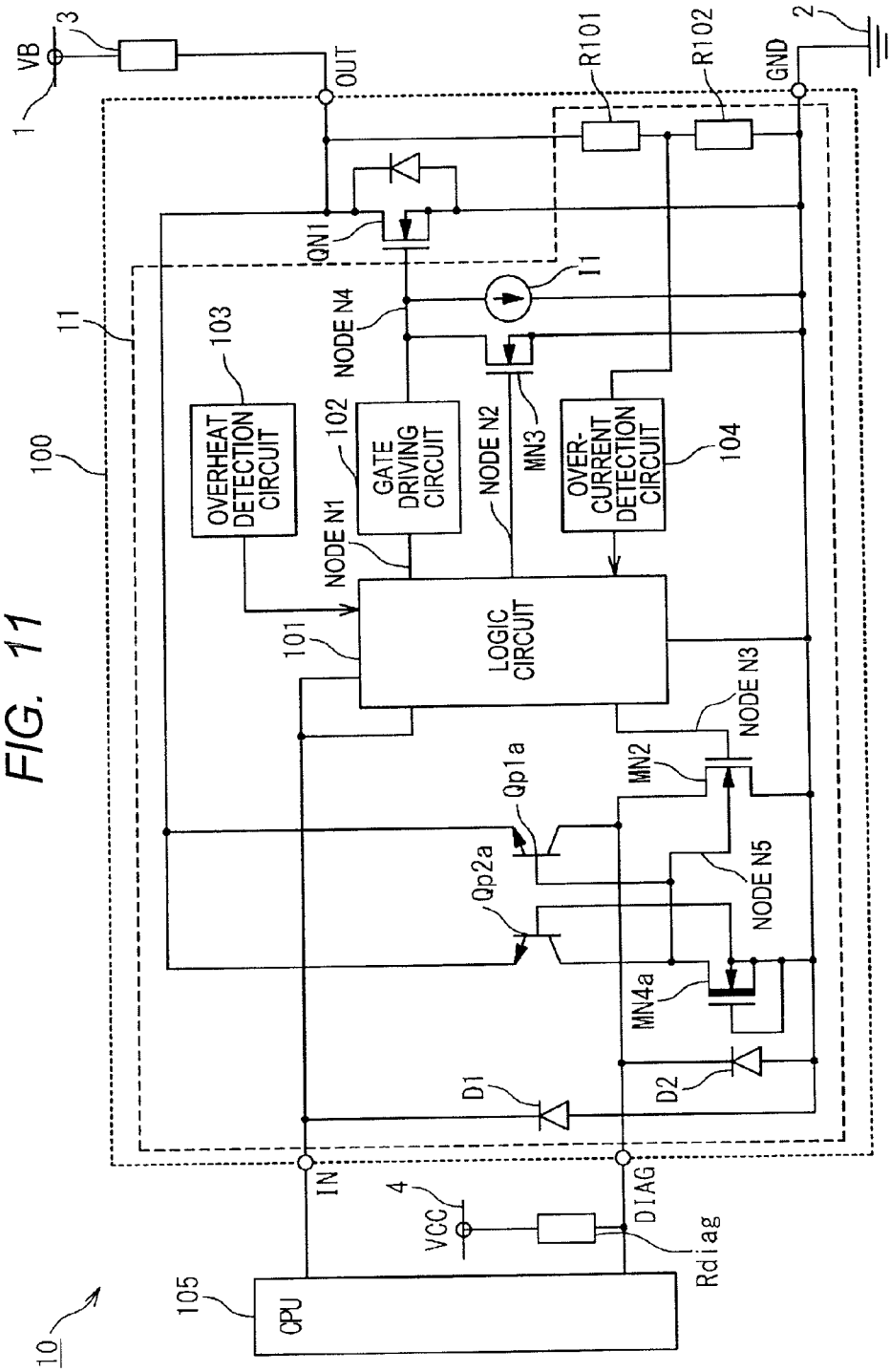
FIG. 11 is a diagram illustrating a configuration including a parasitic transistor that operates in the load driving device according to the first embodiment.

FIG. 11 is a circuit diagram illustrating a configuration of the load driving device 100 including the parasitic NPN bipolar transistors Qp1a and Qp2a according to the first embodiment. With the above configuration, the parasitic NPN bipolar transistor Qp1a has an emitter connected to the output terminal OUT, a collector connected to the self-diagnostic output terminal DIAG, and a base connected to the back gate (substrate terminal) of the n-channel transistor MN2. The parasitic NPN bipolar transistor Qp2a has an emitter connected to the output terminal OUT, a collector connected to the back gate (substrate terminal) of the n-channel transistor MN2, and a base connected to the back gate (substrate terminal) of the n-channel transistor MN4a.

Subsequently, a description will be given of the load driving operation of the load driving device 100 according to the first embodiment with reference to FIG. 9.

When a low-level signal is input to the input terminal IN from the CPU 105, the logic circuit 101 outputs a low-level signal to the node N1, and the gate driving circuit 102 outputs a low-level signal to the node N4. Further, the logic circuit 101 outputs a low level signal to the node N2 and a high level signal to the node N3. As a result, the output transistor QN1 turns off, thereby a current supply to the inductive load 3 is cutoff.

When a high-level signal is input to the input terminal IN from the CPU 105, the logic circuit 101 outputs a high-level signal to the node N1, and the gate driving circuit 102 outputs a high-level signal to the node N4. When the overheat detection circuit 103 or the overcurrent detection circuit 102 does not detect an abnormal state, the logic circuit 101 outputs the low-level signal to the nodes N2 and N3. As a result, the output transistor QN1 turns on, and a current corresponding to the battery voltage VB is supplied to the inductive load 3. On the other hand, when the overheat detection circuit 103 or the overcurrent detection circuit 102 detects an abnormal state, the logic circuit 101 outputs the high-level signal to the nodes N2 and N3. As a result, the output transistor QN1 turns off, thereby a current supply to the inductive load 3 is cutoff.

With the above operation, a signal (Vdiag) that is changed in the logic level at timing shown in FIG. 2 is expected to output to the self-diagnostic output terminal DIAG.

Figure 4A:
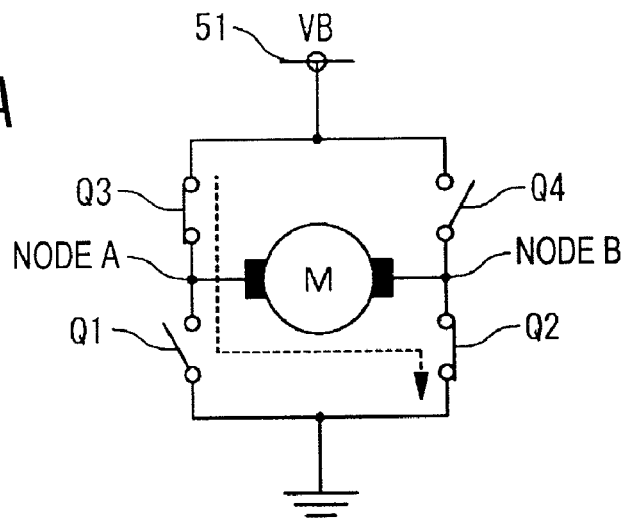
FIGS. 4A to 4C are diagrams illustrating a method of driving a motor by the load driving apparatus.
Figure 4B:
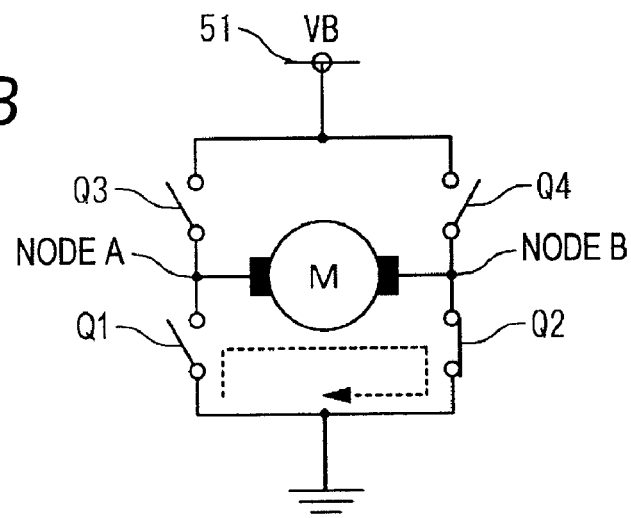
Figure 4C:
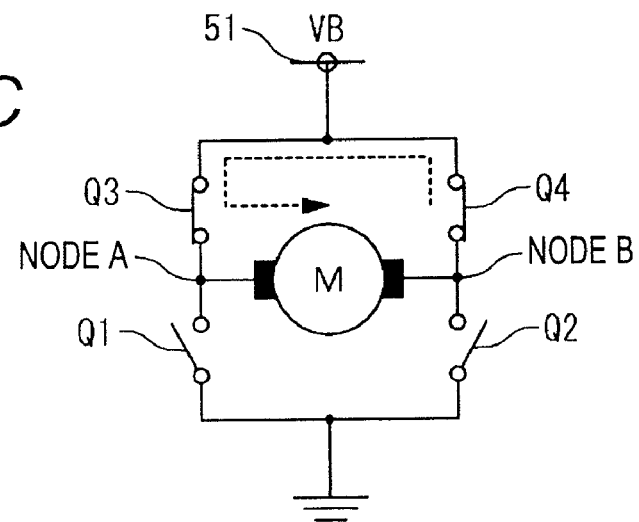

When a motor load (the inductive load 3) illustrated in FIG. 8 is driven with the use of the load driving apparatus 10, operation is conducted in the sequence shown in FIGS. 4A to 4C as in the related art. For example, when the output transistors of the load driving devices 100-2 and 300-1 turn on, and the output transistors of the load driving devices 100-1 and 300-2 turn off, the motor load is energized by the battery voltage VB as illustrated in FIG. 4A. In this situation, when a state in which the motor load is energized (FIG. 4A) transits to a disconnected state (for example, FIG. 4B), a current (negative current) in a direction opposite to that of the on-state current flows in the output transistor QN1 of the load driving device 100-1 due to the induced electromotive force attributable to the motor load. Referring to FIG. 8, when the output transistor of the load driving device 300-1 turns off, the motor load (the inductive load 3) is separated from the first power supply 1 so as to transit from the energized state to the disconnected state. In this case, a regenerative current that circulates in the load driving device 100-1, the inductive load 3, and the load driving device 100-2 in the stated order is generated. A negative current flows through a parallel diode provided between the drain and the source of the output transistor QN1 of the load driving device 100-1 in a direction from the source to the drain (a direction opposite to that of the on-state current).

Referring to FIGS. 10 and 11, a description will be given of the operation of the load driving device 100 according to the first embodiment when the negative current (a current in a direction opposite to that of the on-state current; in this example, a current flowing from the source to the drain) flows in the output transistor QN1 of the load driving device 100.

Referring to FIG. 10, when a current flows from the source of the output transistor QN1 to the drain thereof, a current flows in a p-n junction formed between the n⁻ type epitaxial layer 202 and each of the p type well regions 221 and 231 in a forward direction. As a result, a potential of the n⁻ type epitaxial layer 202 becomes lower than each of the p type well regions 221 and 231 by about −0.7 V.

When the potential of the n⁻ type epitaxial layer 202 becomes lower than the potential of the p type well region 231 by about −0.7 V, the parasitic NPN bipolar transistor Qp2a of the n-channel transistor MN4a turns on. In this example, the collector of the parasitic NPN bipolar transistor Qp2a is connected to the back gate (substrate terminal) of the re-channel transistor MN2 through the node N5. For that reason, the voltage across the n⁻ type epitaxial layer 202 is applied to the back gate (substrate terminal) of the n-channel transistor MN2 through the parasitic NPN bipolar transistor Qp2a. In this case, since the voltage across the n⁻ type epitaxial layer 202 in this situation is about −0.7 V, the back gate (the p type well region 221) of the n-channel transistor MN2 is also about −0.7 V. Accordingly, −0.7 V is applied to both of the base and the emitter of the parasitic NPN bipolar transistor Qp1a formed in the n-channel transistor MN2, and the parasitic NPN bipolar transistor Qp1a is kept an off-state. If the parasitic NPN bipolar transistor Qp1a turns on, a potential of the output terminal is provided to the self-diagnostic output terminal DIAG as a false signal. Whereas the parasitic NPN bipolar transistor Qp2a formed in the n-channel transistor MN4a functions so that the base and the emitter of the parasitic NPN bipolar transistor Qp1a are short-circuited to keep the parasitic NPN bipolar transistor Qp1a in off-state, a correct signal is output to the self-diagnostic output terminal DIAG.

The above operation will be described with reference to FIG. 11. When the negative current flows in the output transistor QN1, the voltage across the output terminal OUT becomes −0.7 V. In this case, a voltage between the base and the emitter of the parasitic NPN bipolar transistor Qp2a is forwardly biased to turn on the parasitic NPN bipolar transistor Qp2a. As a result, the voltage (that is, −0.7 V) of the output terminal OUT is applied to the back gate (substrate terminal) of the n-channel transistor MN2 through the parasitic NPN bipolar transistor Qp2a. As a result, −0.7 V is applied to both of the base and the emitter of the parasitic NPN bipolar transistor Qp1a to turn off the parasitic NPN bipolar transistor Qp1a.

Figure 6:
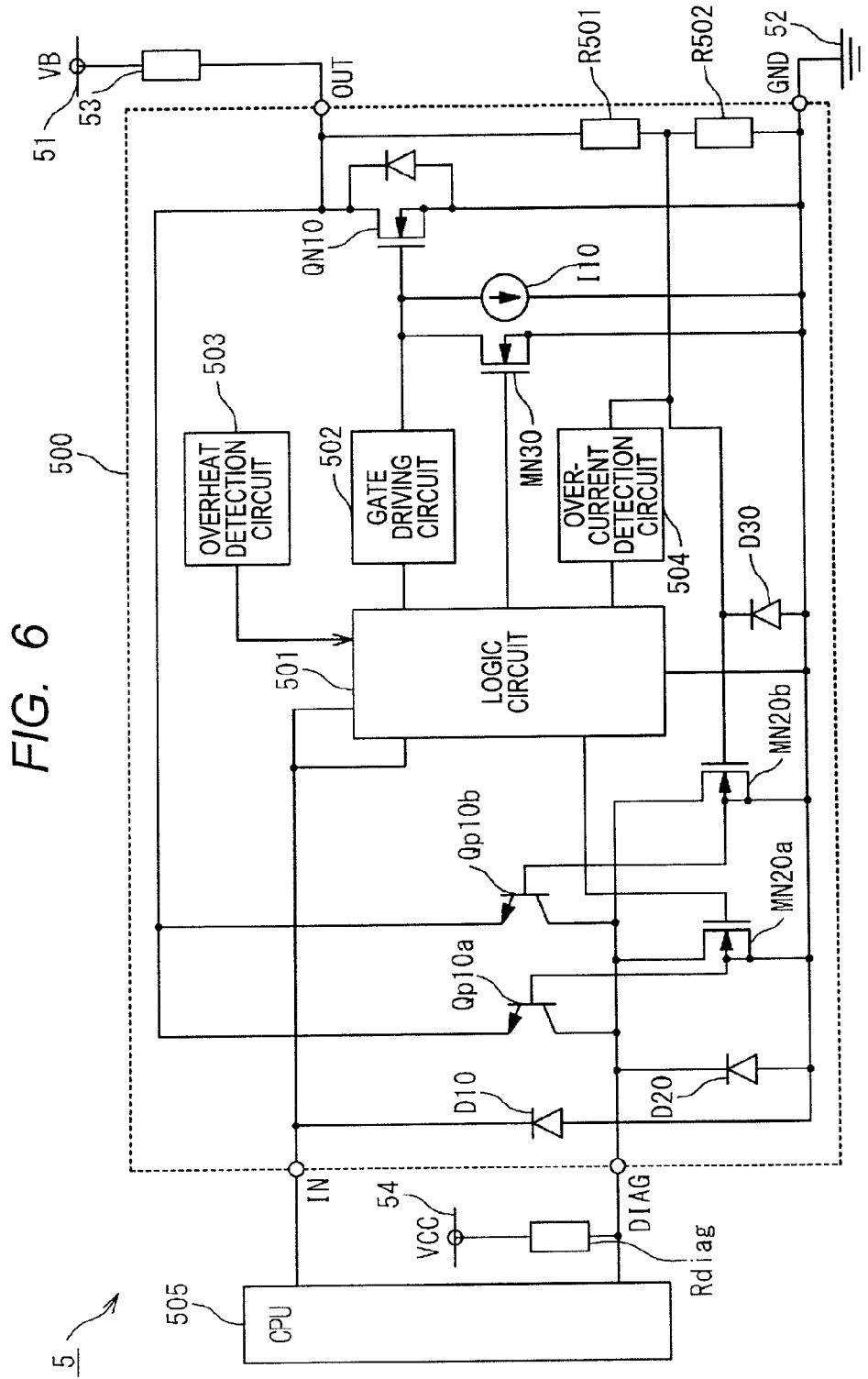
FIG. 6 is a diagram illustrating a configuration including a parasitic transistor that operates in the load driving device of the related art.
Figure 7A:
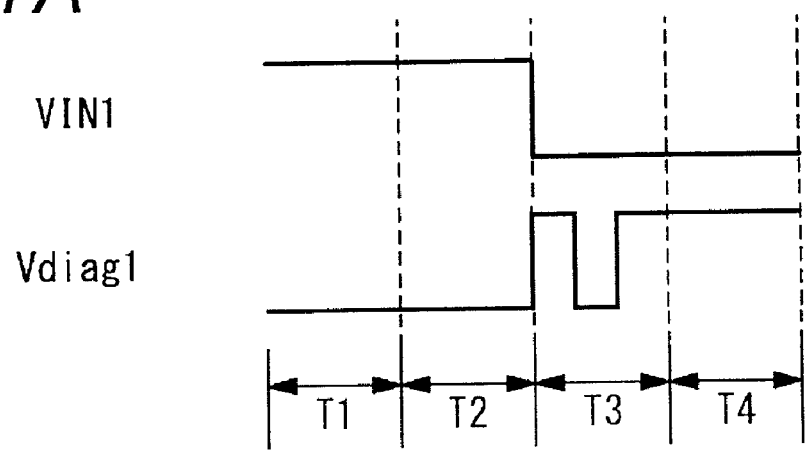
FIGS. 7A and 7B are timing charts showing examples of a false signal that is problematic in the related art.
Figure 7B:
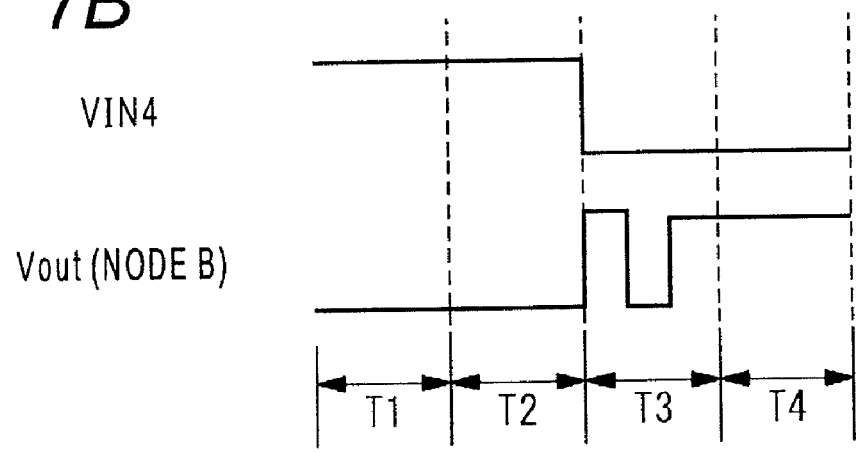

In the related art illustrated in FIG. 6, when the negative current flows in the output transistor QN10, the parasitic NPN bipolar transistors Qp10a and Qp10b turn on. Therefore, a false signal shown in FIG. 7A or FIG. 7B is output to the self-diagnostic output terminal DIAG.

However, in the load driving device 100 illustrated in FIG. 11, even if the negative current flows in the output transistor QN1, the parasitic NPN bipolar transistor Qp1a does not turn on, and maintains the off-state (does not operate). Therefore, no false signal shown in FIG. 7A or FIG. 7B is output to the self-diagnostic output terminal DIAG.

As described above, according to the load driving device 100 of the present invention, the base and the emitter of the parasitic NPN bipolar transistor Qp1a connected to the self-diagnostic output terminal DIAG can be set to the same potential by the parasitic NPN bipolar transistor Qp2a that connects the drain of the n-channel transistor MN4a and the back gate of the n-channel transistor MN2, and operates according to occurrence of the negative current. As a result, the parasitic NPN bipolar transistor Qp1a does not operate, and the false signal to the self-diagnostic output terminal DIAG with the negative current that is problematic in the related art can be prevented from occurring.

2. Second Embodiment

A description will be given in detail of the configuration and operation of the load driving device 100 according to a second embodiment of the present invention.

Figure 12:
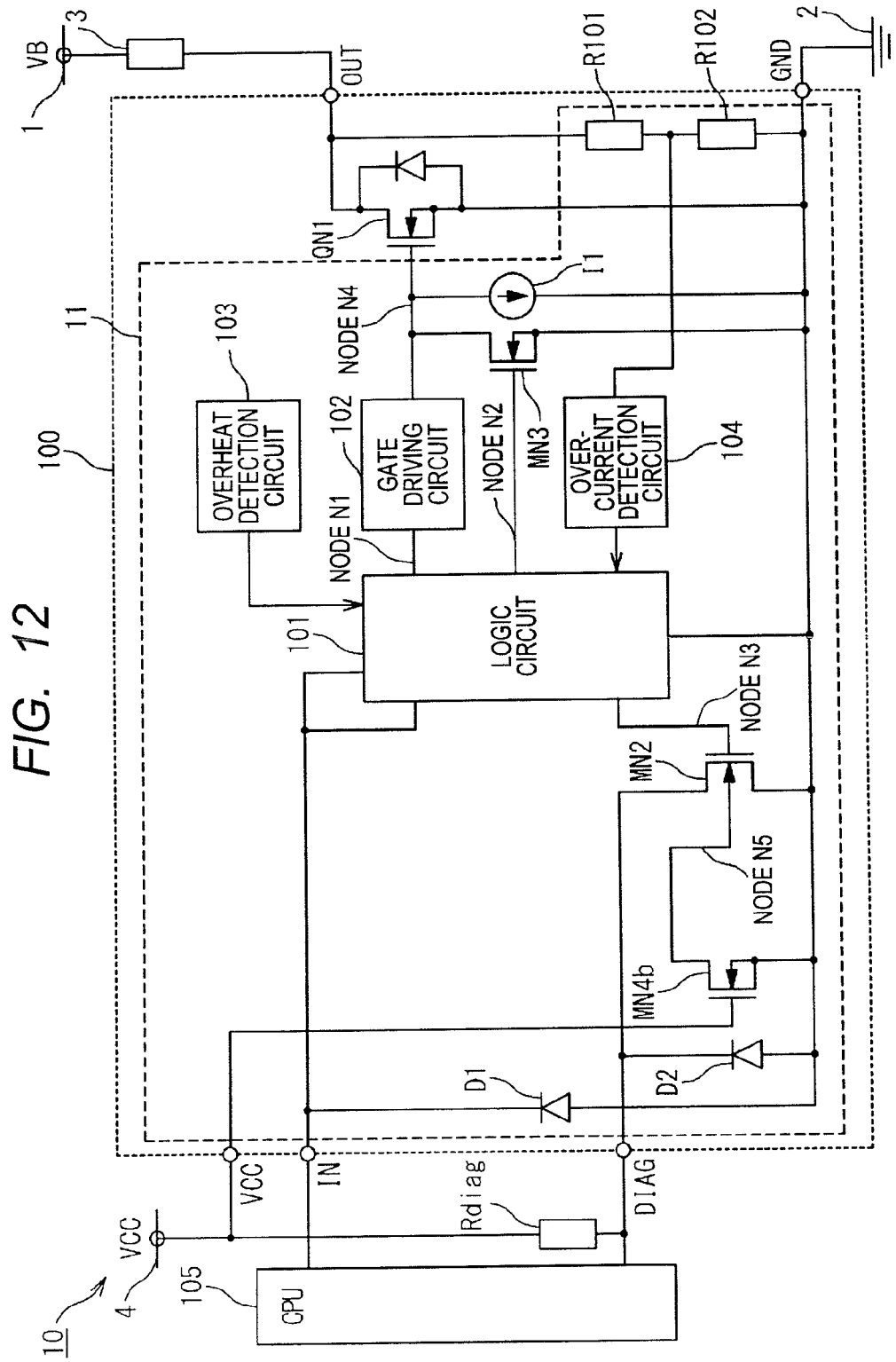
FIG. 12 is a circuit diagram illustrating a configuration of a load driving device according to a second embodiment of the present invention.

FIG. 12 is a circuit diagram illustrating a partial configuration of a load driving apparatus 10 according to a second embodiment of the present invention. The load driving device 100 according to the second embodiment includes an re-channel enhancement type transistor MN4b instead of the re-channel depletion type transistor MN4a in the first embodiment, and additionally includes a power supply terminal VCC to which the supply voltage VCC is applied from the third power supply. The other configurations are identical with those in the first embodiment, and therefore in the following description, the same configuration and operation as those in the first embodiment will be omitted from description, and different configurations and operation will be described.

The n-channel transistor MN4b has a drain connected to the back gate (substrate terminal) of the n-channel transistor MN2, and a source and a back gate (substrate terminal) connected commonly to the ground terminal GND. Also, because the n-channel transistor MN4b is an enhancement type transistor, and has a gate connected to the power supply terminal VCC (supply voltage VCC: 5 V power supply), thereby the n-channel transistor MN4b is in normal on-state. For that reason, the potential of the ground terminal GND, that is, the second supply voltage (in this example, the ground terminal GND) which is applied from the second power supply 2 is applied to the substrate terminal of the n-channel transistor MN2 through the n-channel transistor MN4b. Because the source of the output transistor QN1 is connected to the ground terminal GND, the same voltage as the supply voltage applied to the source of the output transistor QN1 is normally applied to the back gate (substrate terminal) of the n-channel transistor MN2.

Figure 13:
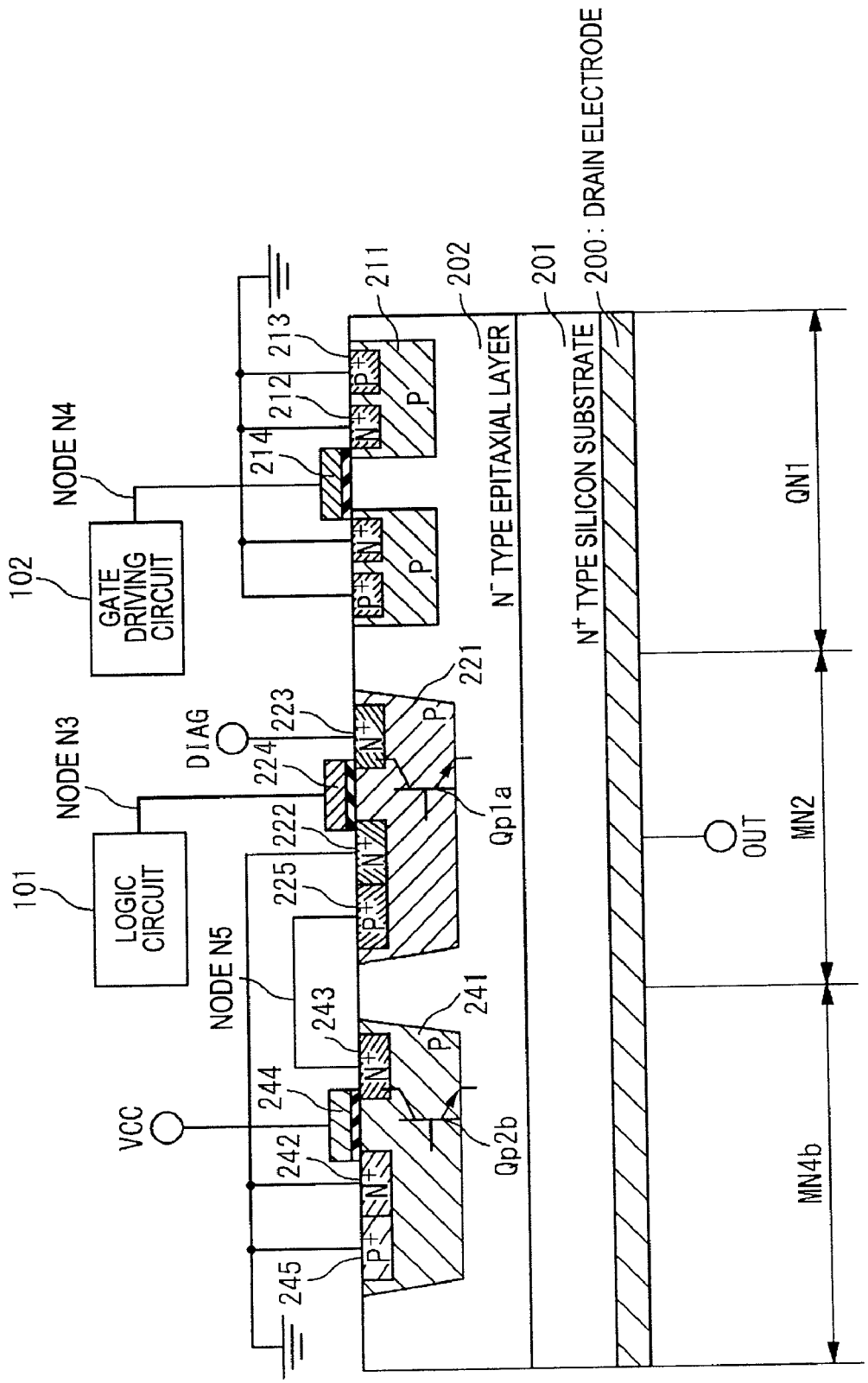
FIG. 13 is a cross-sectional view illustrating a partial transistor structure of a load driving device according to the second embodiment.

FIG. 13 is a cross-sectional view illustrating a partial transistor structure of the load driving device 100 according to the second embodiment. FIG. 13 illustrates a cross-sectional view of the n-channel transistors MN2, MN4b, and the output transistor QN1.

Referring to FIG. 13, in the load driving device 100, the output transistor QN1 and a transistor that controls the output transistor QN1 (in this example, the n-channel transistors MN2 and MN4b) are formed in the same chip (in the same substrate). That is, the output transistor QN1 and the re-channel transistors MN2, MN4b are formed in the same $n^+$ type silicon substrate 201 and the same $n^-$ type epitaxial layer 202. The configurations of the output transistor QN1 and the re-channel transistor MN2 are identical with those in the first embodiment, and therefore a structure different from that in the first embodiment will be described.

In the $n^-$ type epitaxial layer, p type well regions 221 and 241 for forming the n-channel transistors MN2 and MN4b for the control circuits are formed, independently. The n-channel transistor MN4b having the horizontal structure is formed in the p type well region 241.

In the p type well region 241 are formed an $n^+$ type diffusion region 242 functioning as the source of the n-channel transistor MN4b, an $n^+$ type diffusion region 243 functioning as the drain thereof, and a $p^+$ type diffusion region 245 functioning as the substrate terminal that connects the back gate region (the p type well region 241) and the ground terminal GND. Also, a gate electrode 244 connected to the power supply terminal VCC is formed on the p type well region 241 via a gate insulating layer. Further, the $n^+$ type diffusion region (source) 242 is connected to the ground terminal GND, and the $p^+$ type diffusion region (drain) 243 is connected to the node N5.

With the above configuration, in this embodiment, the back gate voltage of the n-channel transistor MN2 can be controlled by a drain voltage across the enhancement n-channel transistor MN4b.

As illustrated in FIG. 13, the parasitic NPN bipolar transistors Qp1a and Qp2b are formed in the n-channel transistors MN2 and MN4b, respectively. In more detail, there are formed the parasitic NPN bipolar transistor Qp1a identical with that in the first embodiment, and the parasitic NPN bipolar transistor Qp2b having the $n^+$ type diffusion region 243, the p type well region 241, and the $n^-$ type epitaxial layer 202 (and the $n^+$ type silicon substrate 201) as a collector, a base, and an emitter thereof, respectively.

Figure 14:
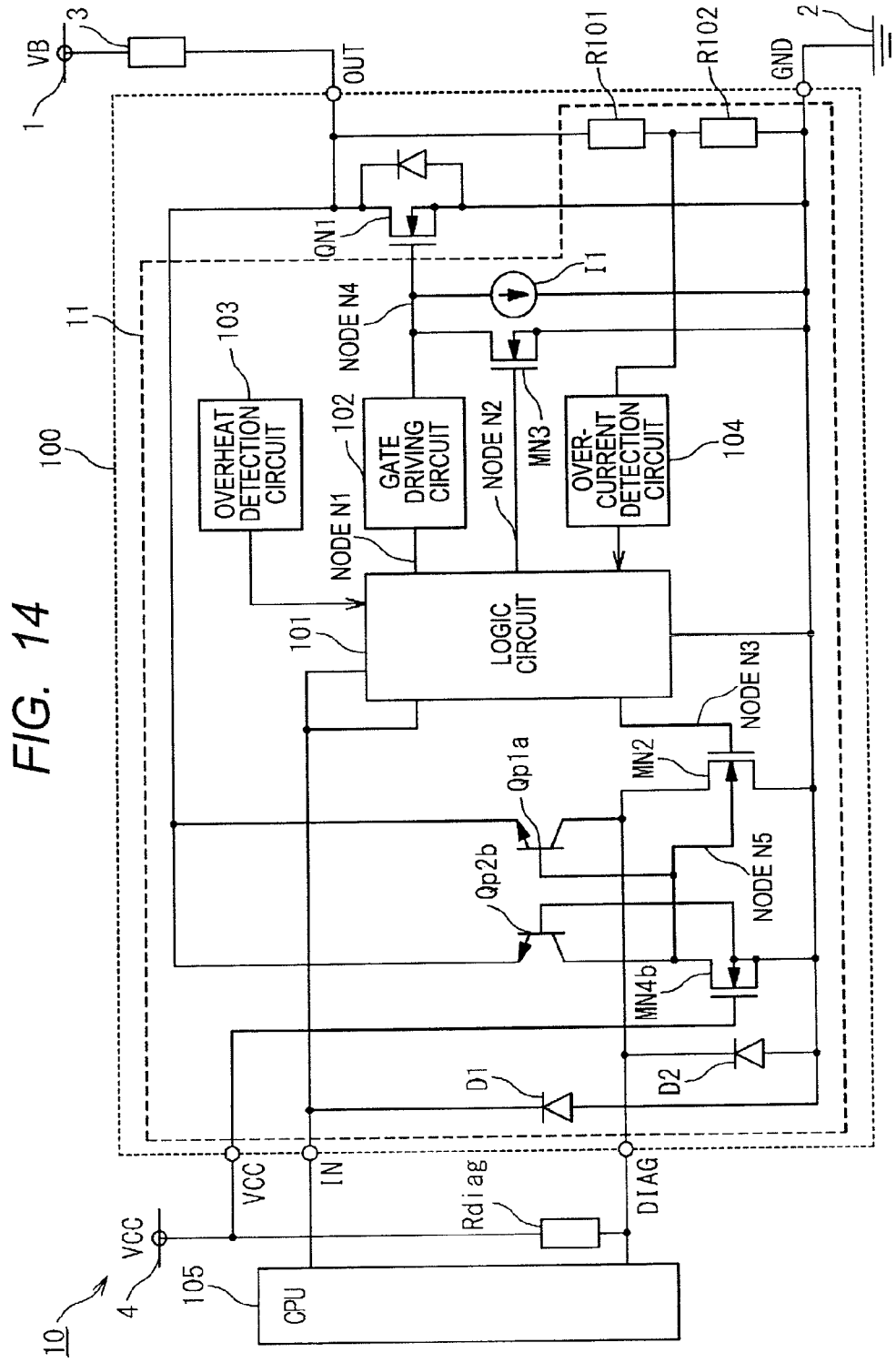
FIG. 14 is a diagram illustrating a configuration including a parasitic transistor that operates in the load driving device according to the second embodiment.

FIG. 14 is a circuit diagram illustrating a configuration of the load driving device 100 including the parasitic NPN bipolar transistors Qp1a and Qp2b according to the second embodiment. With the above configuration, the parasitic NPN bipolar transistor Qp1a has an emitter connected to the output terminal OUT, a collector connected to the self-diagnostic output terminal DIAG, and a base connected to the back gate (substrate terminal) of the n-channel transistor MN2. Also, the parasitic NPN bipolar transistor Qp2b has an emitter connected to the output terminal OUT, a collector connected to the back gate (substrate terminal) of the n-channel transistor MN2, and a base connected to the back gate (substrate terminal) of the n-channel transistor MN4b.

The operation of the load driving device 100 according to the second embodiment is identical with that in the first embodiment except for the operation when the negative current flows in the output transistor QN1, and therefore a description thereof will be omitted.

Referring to FIGS. 13 and 14, a description will be given of the operation of the load driving device 100 according to the second embodiment when the negative current (a current in a direction opposite to that of the on-state current; in this example, a current flowing from the source to the drain) flows in the output transistor QN1 of the load driving device 100.

Referring to FIG. 14, when a current flows from the source of the output transistor QN1 to the drain thereof, a current flows in a p-n junction formed between the $n^-$ type epitaxial layer 202 and each of the p type well regions 221 and 241 in a forward direction. As a result, a potential of the $n^-$ type epitaxial layer 202 becomes lower than each of the p type well regions 221 and 241 by about −0.7 V.

When the potential of the $n^-$ type epitaxial layer 202 becomes lower than the potential of the p type well region 241 by about −0.7 V, the parasitic NPN bipolar transistor Qp2b turns on. In this example, the collector of the parasitic NPN bipolar transistor Qp2b is connected to the back gate (substrate terminal) of the n-channel transistor MN2 through the node N5. For that reason, the voltage across the $n^-$ type epitaxial layer 202 is applied to the back gate (substrate terminal) of the n-channel transistor MN2 through the parasitic NPN bipolar transistor Qp2b. In this case, since the voltage across the $n^-$ type epitaxial layer 202 is about −0.7 V, the back gate (the p type well region 221) of the n-channel transistor MN2 is also about −0.7 V. Accordingly, −0.7 V is applied to both of the base and the emitter of the parasitic NPN bipolar transistor Qp1a formed in the n-channel transistor MN2, and the parasitic NPN bipolar transistor Qp1a is kept an off-state.

The above operation will be described with reference to FIG. 14. When the negative current flows in the output transistor QN1, the voltage across the output terminal OUT becomes −0.7 V. In this case, a voltage between the base and the emitter of the parasitic NPN bipolar transistor Qp2b is forwardly biased to turn on the parasitic NPN bipolar transistor Qp2b. As a result, the voltage (that is, −0.7 V) of the output terminal OUT is applied to the back gate (substrate terminal) of the n-channel transistor MN2 through the parasitic NPN bipolar transistor Qp2b. As a result, −0.7 V is applied to both of the base and the emitter of the parasitic NPN bipolar transistor Qp1a to turn off the parasitic NPN bipolar transistor Qp1a.

As described above, in the load driving device 100 illustrated in FIG. 12, even if the negative current flows in the output transistor QN1, the parasitic NPN bipolar transistor Qp1a does not turn on, and maintains the off-state (does not operate). Therefore, no false signal shown in FIG. 7A or FIG. 7B is output to the self-diagnostic output terminal DIAG.

Also, in the load driving device 100 according to this embodiment, the false signal can be prevented from occurring at the time of generating the negative current, without using the depletion type transistor.

3. Third Embodiment

A configuration and operation of the load driving device 100 according to a third embodiment of the present invention will be described in detail with reference to FIGS. 15 to 17.

In the first and second embodiments, the load driving device 100 is described, which prevents the false signal to the self-diagnostic output terminal DIAG, which is attributable to the occurrence of the negative current. It is not apply only to the false signal to the self-diagnostic output terminal DIAG, malfunction of another control circuits can be prevented. In the third embodiment, a description will be given of the load driving device 100 that prevents the malfunction caused by the negative current in the n-channel transistor MN3 that controls the on/off operation of the output transistor QN1.

Figure 15:
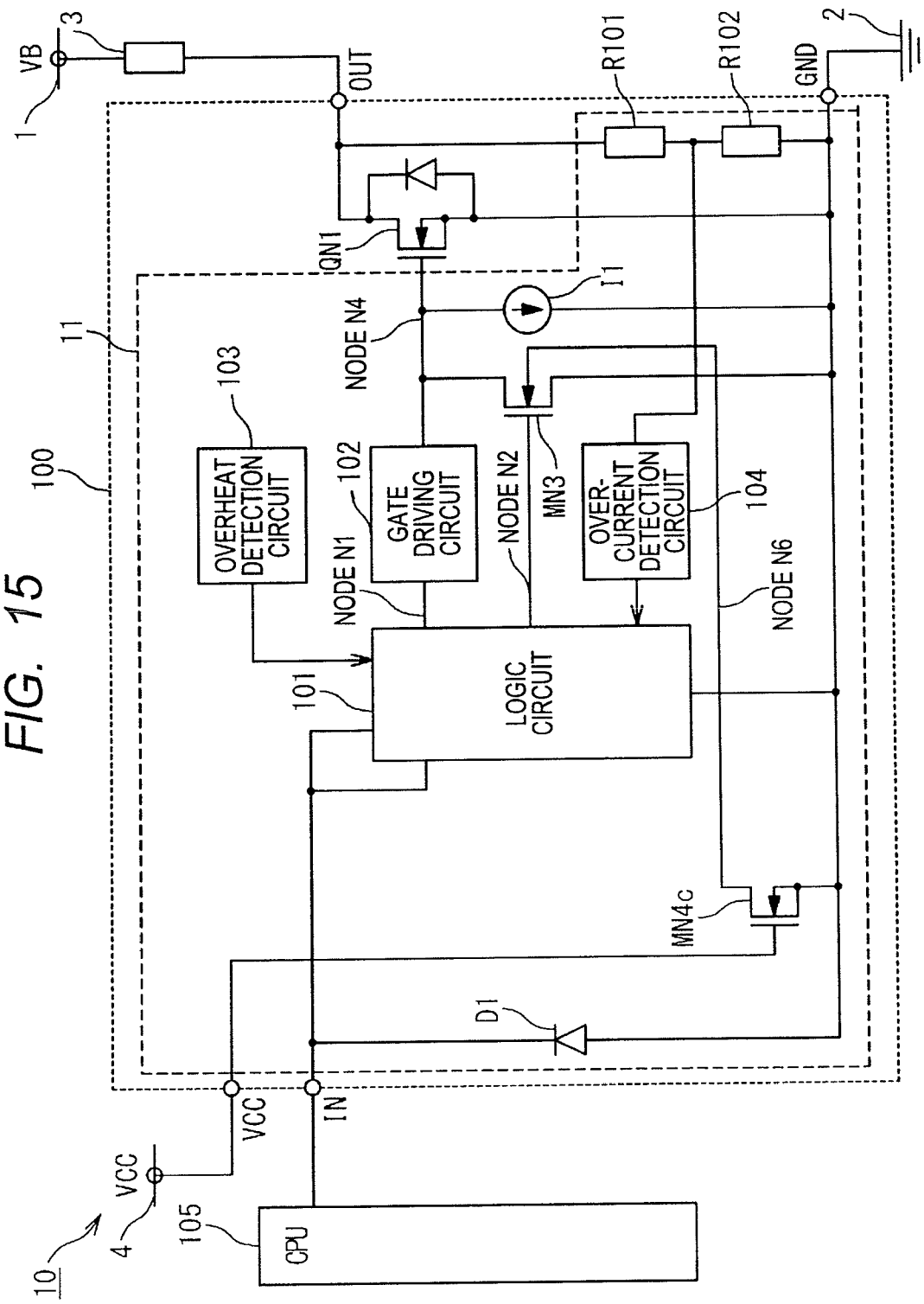
FIG. 15 is a circuit diagram illustrating a configuration of a load driving device according to a third embodiment of the present invention.

FIG. 15 is a circuit diagram illustrating a configuration of the load driving device 100 according to the third embodiment of the present invention. The load driving device 100 according to the third embodiment includes an n-channel transistor MN4c in addition to the configuration of the load driving device 100 in the second embodiment. The other configurations are identical with those in the second embodiment. Therefore, the same configuration and operation as those in the second embodiment will be omitted from the following description, and different configurations and operation will be described. In FIG. 15, the n-channel transistor MN2, the self-diagnostic output terminal DIAG, and the n-channel transistor MN4b, which conduct the self-diagnostic output, as described in the second embodiment, are omitted.

The n-channel transistor MN4c has a drain connected to the back gate (substrate terminal) of the n-channel transistor MN3 through a node N6, and a source and a back gate (substrate terminal) connected commonly to the ground terminal GND. Also, because the n-channel transistor MN4c is an enhancement transistor, and has a gate connected to the power supply terminal VCC (supply voltage VCC: 5V power supply), the re-channel transistor MN4c is in normal on-state. For that reason, the potential of the ground terminal GND, that is, the second supply voltage (in this example, the ground terminal GND) which is applied from the second power supply 2 is applied to the substrate terminal of the n-channel transistor MN3 through the n-channel transistor MN4c. Because the source of the output transistor QN1 is connected to the ground terminal GND, the same voltage as the supply voltage applied to the source of the output transistor QN1 is normally applied to the back gate (substrate terminal) of the n-channel transistor MN3.

Figure 16:
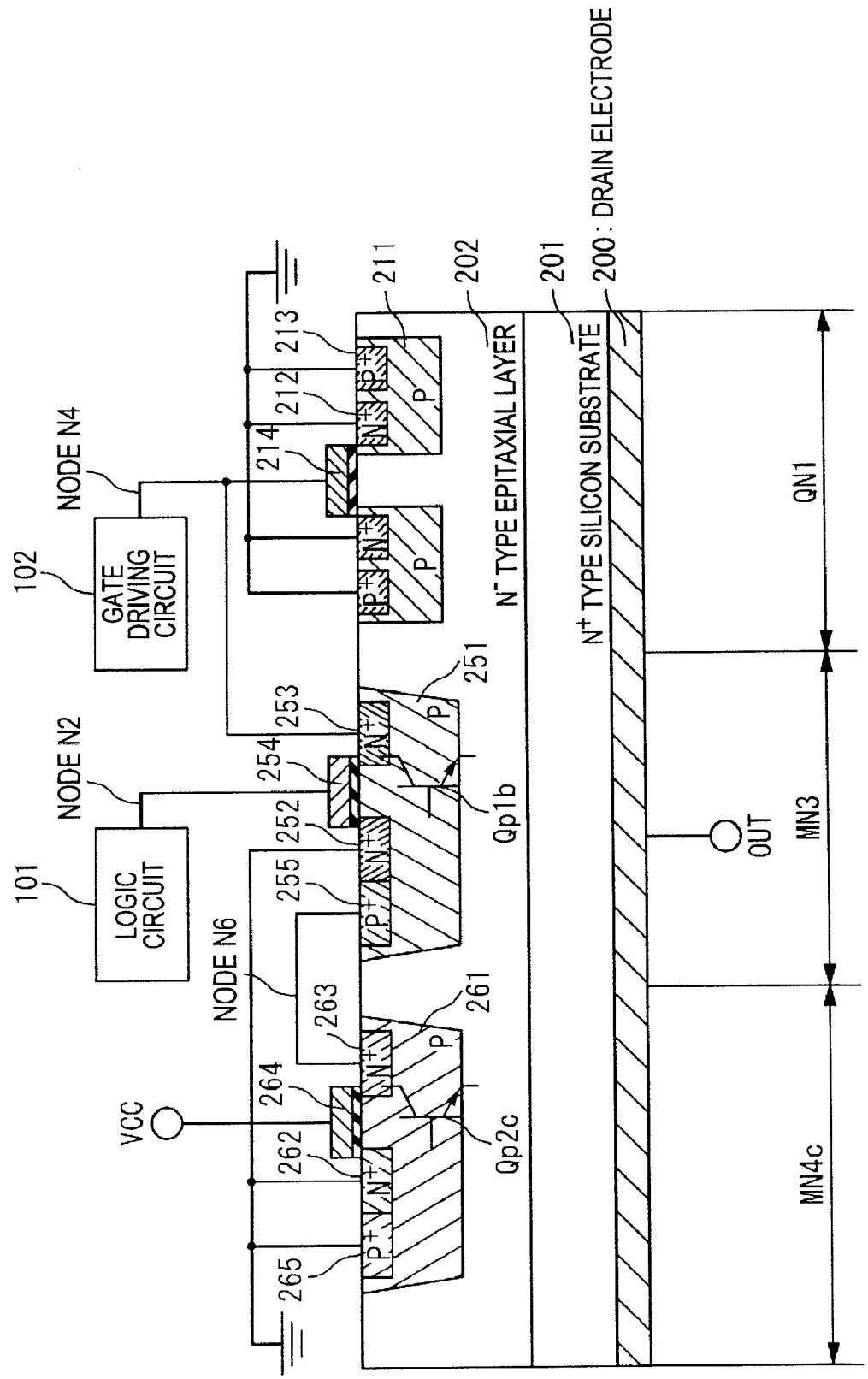
FIG. 16 is a cross-sectional view illustrating a partial transistor structure of a load driving device according to the third embodiment.

FIG. 16 is a cross-sectional view illustrating a partial transistor structure of the load driving device 100 according to the third embodiment. FIG. 16 illustrates a cross-sectional view of the n-channel transistors MN3, MN4c, and the output transistor QN1.

Referring to FIG. 16, in the load driving device 100 according to the present invention, the output transistor QN1 and a transistor that controls the output transistor QN1 (in this example, the n-channel transistors MN3 and MN4c) are formed in the same chip (in the same substrate). That is, the output transistor QN1 and the n-channel transistors MN3, MN4c are formed in the same n+ type silicon substrate 201 and the same n− type epitaxial layer 202. The configuration of the output transistor QN1 is identical with that in the second embodiment, and therefore a structure different from that in the second embodiment will be described.

In the n− type epitaxial layer, p type well regions 251 and 261 for forming the n-channel transistors MN3 and MN4b for the control circuits are formed, independently. The n-channel transistor MN3 having the horizontal structure is formed in the p type well region 251, and the n-channel transistor MN4c having the horizontal structure is formed in the p type well region 261.

Specifically, in the p type well region 251 are formed an n+ type diffusion region 252 functioning as the source of the n-channel transistor MN3, an n+ type diffusion region 253 functioning as the drain thereof, and a p+ type diffusion region 255 functioning as the substrate terminal that connects the back gate (the p type well region 251) and the node N6. Also, a gate electrode 254 connected to the logic circuit 101 through the node N2 is formed on the p type well region 251 via a gate insulating layer. Further, the n+ type diffusion region (source) 252 is connected to the ground terminal GND, and the n+ type diffusion region (drain) 253 is connected to the gate driving circuit 102 through the node N4.

In the p type well region 261 are formed an n+ type diffusion region 262 functioning as the source of the n-channel transistor MN4c, an n+ type diffusion region 263 functioning as the drain thereof, and a p+ type diffusion region 265 functioning as the substrate terminal that connects the back gate (the p type well region 261) and the ground terminal GND. Also, a gate electrode 264 connected to the power supply terminal VCC is formed on the p type well region 261 via a gate insulating layer. Further, the n+ type diffusion region (source) 262 is connected to the ground terminal GND, and the n+ type diffusion region (drain) 263 is connected to the node N6.

With the above configuration, in this embodiment, the back gate voltage of the n-channel transistor MN3 can be controlled by a drain voltage across the enhancement n-channel transistor MN4c.

As illustrated in FIG. 16, the parasitic NPN bipolar transistors Qp1b and Qp2c are formed in the n-channel transistors MN3 and MN4c, respectively. In more detail, there are formed the parasitic NPN bipolar transistor Qp1b having the n+ type diffusion region 253, the p type well region 251, and the n− type epitaxial layer 202 (and the n+ type silicon substrate 201) as a collector, a base, and an emitter thereof, respectively, and the parasitic NPN bipolar transistor Qp2c having the n+ type diffusion region 263, the p type well region 261, and the n− type epitaxial layer 202 (and the n+ type silicon substrate 201) as a collector, a base, and an emitter thereof, respectively.

Figure 17:
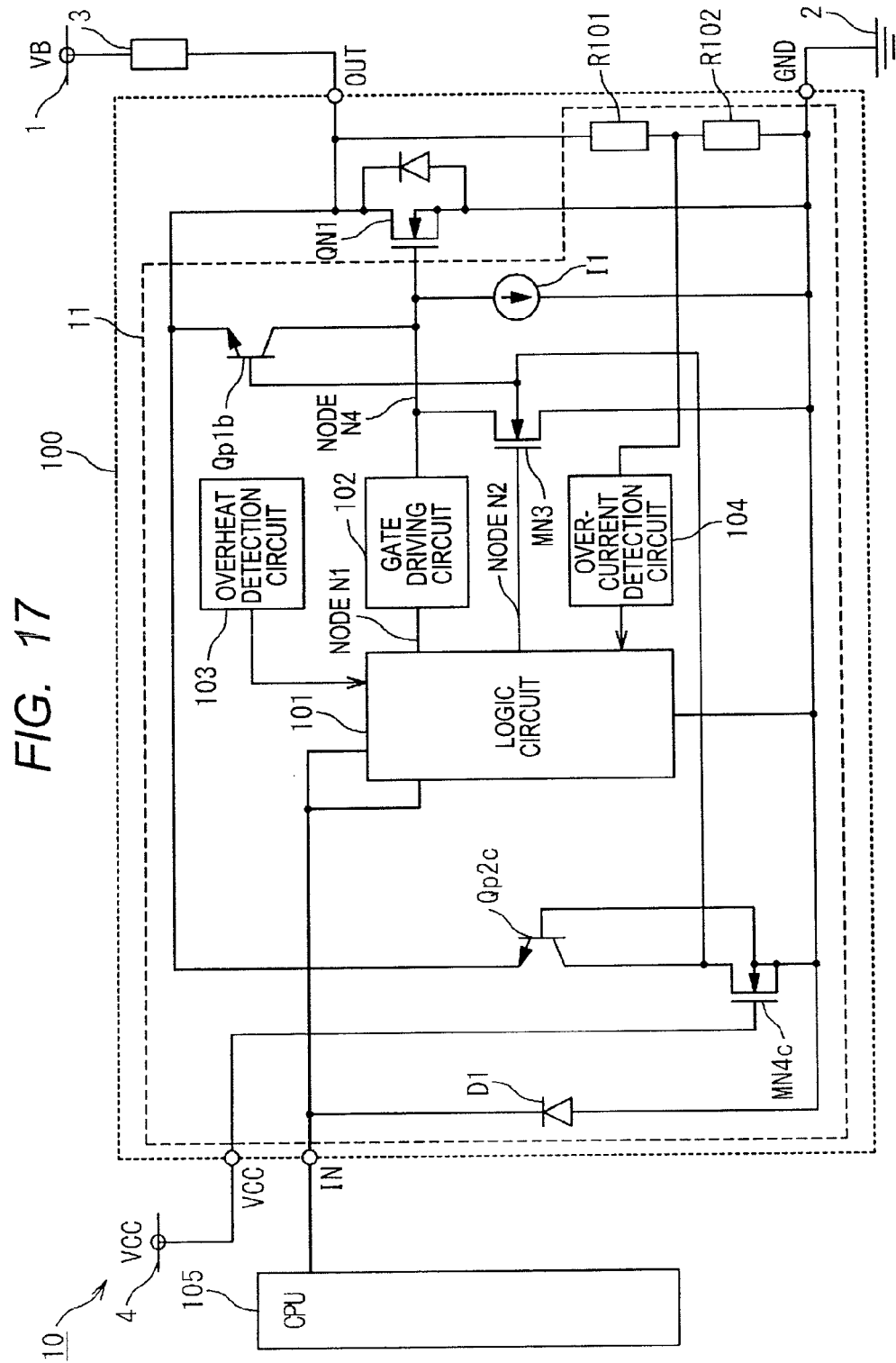
FIG. 17 is a diagram illustrating a configuration including a parasitic transistor that operates in the load driving device according to the third embodiment.

FIG. 17 is a circuit diagram illustrating a configuration of the load driving device 100 including the parasitic NPN bipolar transistors Qp1b and Qp2c according to the third embodiment. With the above configuration, the parasitic NPN bipolar transistor Qp1b has an emitter connected to the output terminal OUT, a collector connected to the node N4 (gate of the output transistor QN1), and a base connected to the back gate (substrate terminal) of the n-channel transistor MN3. Also, the parasitic NPN bipolar transistor Qp2c has an emitter connected to the output terminal OUT, a collector connected to the back gate (substrate terminal) of the n-channel transistor MN3, and a base connected to the back gate (substrate terminal) of the n-channel transistor MN4c.

The operation of the load driving device 100 according to the third embodiment is identical with that in the first embodiment except for the operation when the negative current flows in the output transistor QN1, and therefore a description thereof will be omitted.

Referring to FIGS. 16 and 17, a description will be given of the operation of the load driving devices 100 according to the third embodiment when the negative current (a current in a direction opposite to that of the on-state current; in this example, a current flowing from the source to the drain) flows in the output transistor QN1 of the load driving device 100.

Referring to FIG. 16, when a current flows from the source of the output transistor QN1 to the drain thereof, a current flows in a p-n junction formed between the n− type epitaxial layer 202 and each of the p type well regions 251 and 261 in a forward direction. As a result, a potential of the n⁻ type epitaxial layer 202 becomes lower than each of the p type well regions 251 and 261 by about −0.7 V.

When the potential of the n⁻ type epitaxial layer 202 becomes lower than the potential of the p type well region 261 by about −0.7 V, the parasitic NPN bipolar transistor Qp2c turns on. In this example, the collector of the parasitic NPN bipolar transistor Qp2c is connected to the back gate (substrate terminal) of the n-channel transistor MN3 through the node N6. For that reason, the voltage across the n⁻ type epitaxial layer 202 is applied to the back gate (substrate terminal) of the n-channel transistor MN3 through the parasitic NPN bipolar transistor Qp2c. In this case, since the voltage across the n⁻ type epitaxial layer 202 is about −0.7 V, the back gate (the p type well region 251) of the n-channel transistor MN3 is also about −0.7 V. Accordingly, −0.7 V is applied to both of the base and the emitter of the parasitic NPN bipolar transistor Qp1b formed in the n-channel transistor MN3, and the parasitic NPN bipolar transistor Qp1b is kept an off-state. If the parasitic NPN bipolar transistor Qp1b turns on, a potential of the output terminal is provided to the node N4 (gate of the output transistor QN1) as a false signal. Whereas the parasitic NPN bipolar transistor Qp2c formed in the n-channel transistor MN4c functions so that the base and the emitter of the parasitic NPN bipolar transistor Qp1b are short-circuited to keep the parasitic NPN bipolar transistor Qp1b in off-state, a correct signal is output to the node N4.

The above operation will be described with reference to FIG. 17. When the negative current flows in the output transistor QN1, the voltage across the output terminal OUT becomes −0.7 V. In this case, a voltage between the base and the emitter of the parasitic NPN bipolar transistor Qp2c is forwardly biased to turn on the parasitic NPN bipolar transistor Qp2c. As a result, the voltage (that is, −0.7 V) of the output terminal OUT is applied to the back gate (substrate terminal) of the n-channel transistor MN3 through the parasitic NPN bipolar transistor Qp2c. As a result, −0.7 V is applied to both of the base and the emitter of the parasitic NPN bipolar transistor Qp1b to turn off the parasitic NPN bipolar transistor Qp1b.

As described above, in the load driving device 100 illustrated in FIG. 15, even if the negative current flows in the output transistor QN1, the parasitic NPN bipolar transistor Qp1b does not turn on, and maintains the off-state (does not operate). Therefore, no false signal is output in response to the control signal output to the gate of the output transistor QN1.

Referring to FIG. 6, in the load driving device 500 of the related art, since the substrate terminal of the n-channel transistor MN30 is connected to the ground terminal GND, when a negative current flows in the output transistor QN10, the parasitic NPN transistor (not shown) formed in the n-channel transistor MN30 turns on. As a result, the voltage across the gate of the output transistor QN10 may decrease down to the potential of the output terminal OUT to turn off the output transistor QN10.

In this case, as illustrated in FIG. 4B, a negative current (regenerative current) flows in the output transistor Q1 (the output transistor QN10 illustrated in FIG. 1). In this situation, there is a method in which the output transistor QN1 is made turn on by the control circuit to allow the negative current to flow through the channel with the result that the power loss is reduced. However, the load driving device 500 of the related art operates so that the parasitic NPN bipolar transistor Qp1c turns on because of the above reason, and the output transistor QN10 (Q1) turns off. Therefore, the negative current flows in the body diode of the output transistor QN10 (Q1) to increase the power loss.

On the contrary, in the load driving device 100 according to this embodiment, when the negative current flows in the output transistor QN1, the parasitic NPN bipolar transistor Qp1c does not turn on. Therefore, control can be conducted so that the output transistor QN1 surely turns on even while the negative current flows. As a result, the power loss caused by the negative current can be reduced.

4. Fourth Embodiment

A configuration and operation of a load driving device 300 according to a fourth embodiment of the present invention will be described in detail with reference to FIGS. 18 to 20.

In the first to third embodiments, the configuration and operation of the load driving device 100 configuring the low side switch are described. Similarly, in the load driving device 300 configuring the high side switch, malfunction of the control circuit which is attributable to the negative current can be prevented. In the fourth embodiment, a description will be given of the load driving device 300 used as the high side switch in the load driving apparatus 10 illustrated in FIG. 8.

Figure 18:
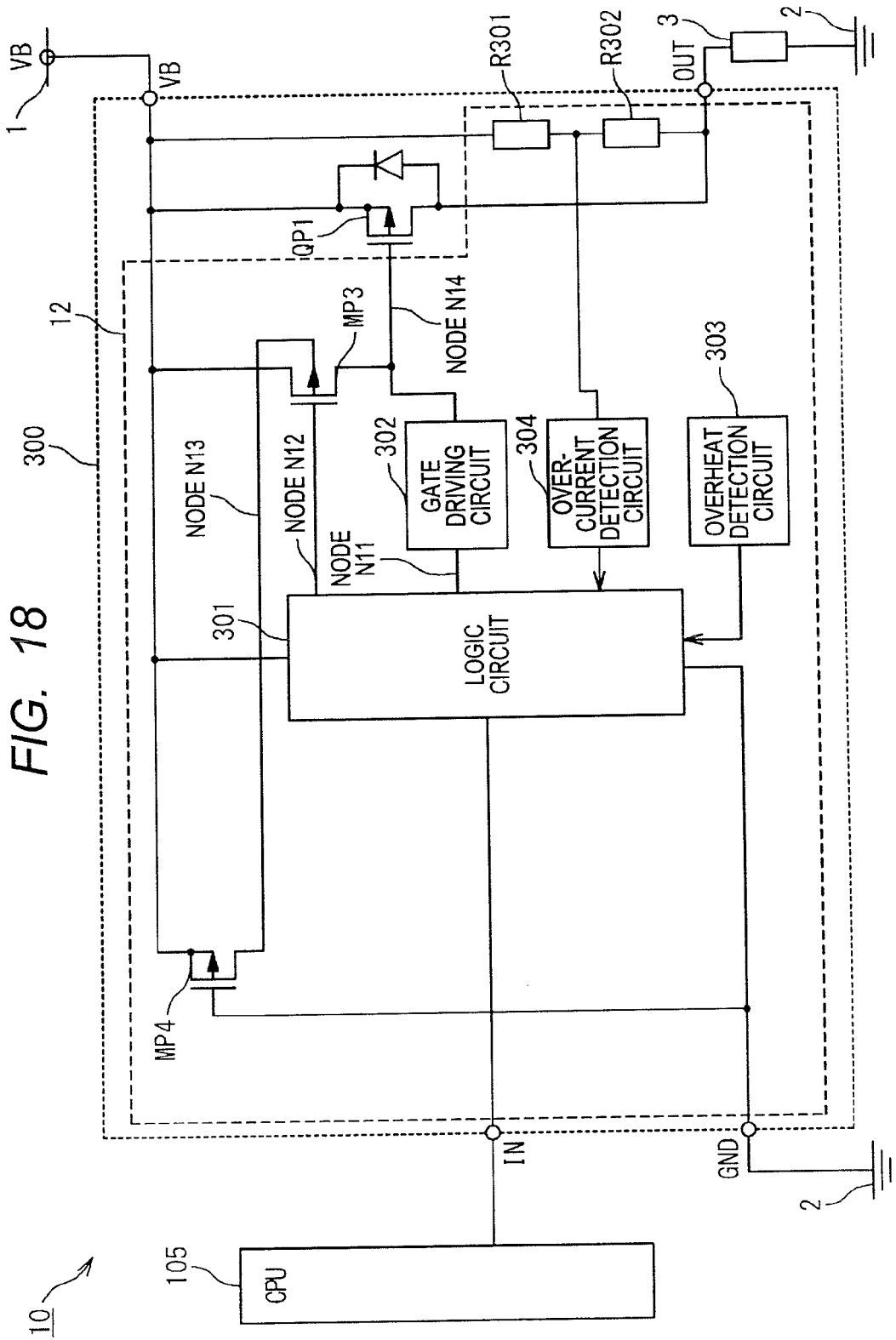
FIG. 18 is a circuit diagram illustrating a configuration of a load driving device according to a fourth embodiment of the present invention.

FIG. 18 is a circuit diagram illustrating a partial configuration of the load driving apparatus 10 according to the fourth embodiment of the present invention. The load driving apparatus 10 according to the fourth embodiment includes the load driving device 300, the CPU 105, the first power supply 1, the second power supply 2, the input terminal IN, the output terminal OUT, the battery voltage VB, and the ground terminal GND.

The load driving device 300 according to the fourth embodiment includes a logic circuit 301, a gate driving circuit 302, an overheat detection circuit 303, an overcurrent detection circuit 304, an output transistor QP1, p-channel transistors MP3, MP4, and resistors R301, R302.

The output terminal OUT is connected to the second power supply 2 through the inductive load 3. The power supply terminal VB is connected to the first power supply 1, and the ground terminal GND is connected to the second power supply 2. The input terminal IN is connected to the CPU 105. In this embodiment, the first power supply 1 applies the battery voltage VB, and the second power supply 2 applies the ground terminal GND.

The logic circuit 301 outputs a control signal to the nodes N11 and N12. The control signal is controlled by an input signal from the input terminal IN, an overheat detection signal from the overheat detection circuit 303, or an overcurrent detection signal from the overcurrent detection circuit 304. The control signal output to the node N11 is input to the gate driving circuit 302. The control signal output to the node N12 is input to a gate of the p-channel transistor MP3.

The gate driving circuit 302 outputs a signal having a signal level (high level or low level) corresponding to the control signal from the node N11 (logic circuit 301) to a gate (node N14) of the output transistor QP1 to control the on/off operation of the output transistor QP1.

The output transistor QP1 has a drain connected to the output terminal OUT, a source connected to the power supply terminal VB, and a gate connected to the gate driving circuit 302 through the node N14. The output transistor QP1 is preferably formed of a power MOSFET.

The p-channel transistors MP3 is connected between the gate (node N14) and the source (power supply terminal VB) of the output transistor QP1. In more detail, the p-channel transistor MP3 has a drain connected to the node N14, a source connected to the power supply terminal VB (the first power supply 1), and the gate connected to the node N12 which is one of output terminals of the logic circuit 301.

The logic circuit 301 outputs the control signal for turning off the p-channel transistor MP3 to the node N12 upon receiving an overheat detection signal indicating that the load driving device 300 (or the load driving apparatus 10) is in an over-temperature state, or upon receiving an overcurrent detection signal indicating that an overcurrent flows in the inductive load 3. As a result, the p-channel transistors MP3 operates to turn off the output transistor QP1 upon detecting the abnormality of the load driving device 300 such as the over-temperature state or the overcurrent state. Also, when the load driving apparatus 10 (the load driving device 300) is in a normal state, the p-channel transistor MP3 turns off, and the output transistor QP1 controls a current that flows in the inductive load 3 by operation corresponding to the control signal from the logic circuit 301.

The overheat detection circuit 303 monitors a temperature (or an ambient temperature) of the load driving device 300, and outputs an over-temperature detection signal indicative of abnormality to the logic circuit 301 when a temperature of the load driving device 300 exceeds a given temperature.

The overcurrent detection circuit 304 monitors a divided voltage obtained by the voltage divider resistors R301 and R302 which are connected between the drain and the source of the output transistor QP1, to thereby detect whether there is an abnormality between the drain and the source of the output transistor QP1, or not. In more detail, one end of the voltage divider resistor R301 is connected to a source terminal of the output transistor QP1, and the other end thereof is connected to one end of the voltage divider resistor R302. The other end of the resistor R302 is connected to a drain terminal of the output transistor QP1. A connection point between the resistors R301 and R302 is commonly connected to the overcurrent detection circuit 304. The divided voltage of the voltage between the drain and the source of the output transistor QP1 is input to the overcurrent detection circuit 304 through the connection point.

The overcurrent detection circuit 304 monitors a voltage between the drain and the source of the output transistor QP1 to monitor a current that flows in the output transistor QP1. For example, when the voltage between the drain and the source of the output transistor QP1 is larger than a given voltage, the overcurrent detection circuit 304 determines that an overcurrent flows in the output transistor QP1, and outputs the overcurrent detection signal indicative of abnormality to the logic circuit 301.

When the overheat detection circuit 303 or the overcurrent detection circuit 304 outputs the detection signal indicative of abnormality, the logic circuit 301 outputs a signal of low level to the node N12, and turns on the p-channel transistor MP3.

The p-channel transistor MP4 is an enhancement type transistor, and has a drain connected to a back gate (substrate terminal) of the p-channel transistor MP3 through a node N13, a source and a back gate (substrate terminal) connected commonly to power supply terminal VB, and a gate connected to the ground terminal GND. With this connection, the p-channel transistor MP4 is in normal on-state. For that reason, the potential of the power supply terminal VB, that is, the first supply voltage (in this example, power supply terminal VB) which is applied from the first power supply 1 is applied to the substrate terminal of the p-channel transistor MP3 through the p-channel transistor MP4. Because the source of the output transistor QP1 is connected to the power supply terminal VB, the same voltage as the supply voltage applied to the source of the output transistor QP1 is normally applied to the back gate (substrate terminal) of the p-channel transistor MP3.

Figure 19:
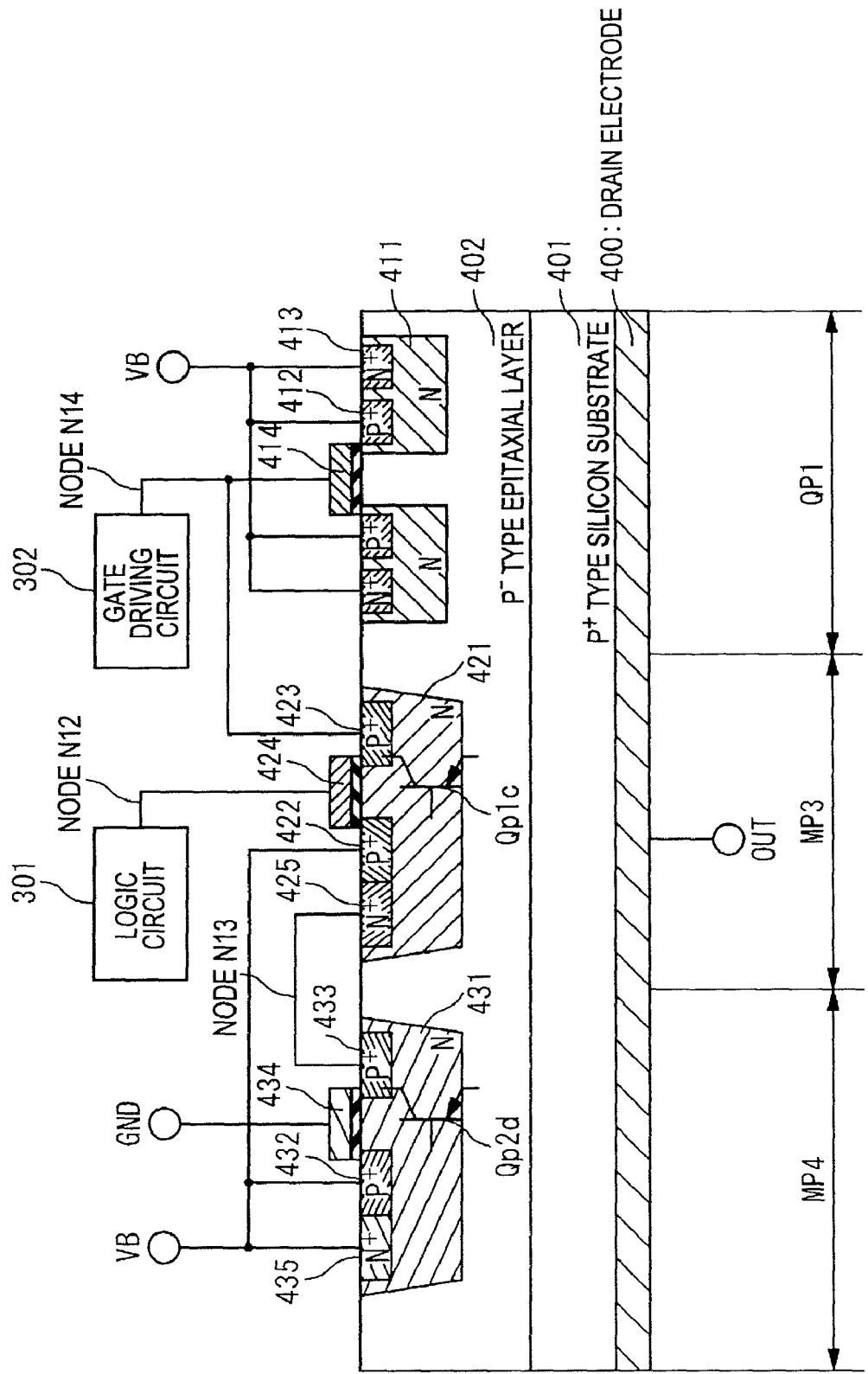
FIG. 19 is a cross-sectional view illustrating a partial transistor structure of a load driving device according to the fourth embodiment.

FIG. 19 is a cross-sectional view illustrating a partial transistor structure of the load driving device 300 according to the fourth embodiment. FIG. 19 illustrates a cross-sectional view of the p-channel transistors MP3, MP4, and the output transistor QP1.

Referring to FIG. 19, in the load driving device 300 of the present invention, the output transistor QP1 and a transistor that controls the output transistor QP1 (in this example, the p-channel transistors MP3 and MP4) are formed in the same chip (in the same substrate). That is, the output transistor QP1 and the p-channel transistors MP3, MP4 are formed in the same $p^+$ type silicon substrate 401 and the same $p^-$ type epitaxial layer 402. In this example, the $p^-$ type epitaxial layer 402 is formed on the $p^+$ type silicon substrate 401, and a drain electrode 400 is deposited on a rear surface of the $p^+$ type silicon substrate 401 opposite from the $p^-$ type epitaxial layer 402.

The output transistor QP1 is a transistor with a vertical structure having the $p^+$ type silicon substrate 401 on which the drain electrode 400 is deposited, and the $p^-$ type epitaxial layer 402 as a drain. An n type base region 411 forming a back gate region of the output transistor QP1 is formed in an upper portion of the $p^-$ type epitaxial layer 402. Within the n type base region 411 are formed a $p^+$ type diffusion region 412 functioning as a source region, and an $n^+$ type diffusion region 413 functioning as a substrate terminal that connects the back gate and power supply terminal VB. Also, a gate electrode 414 connected to the gate driving circuit 302 through the node N14 is formed on a gate insulating layer. Further, the drain electrode 400 is connected with the output terminal OUT, and the $p^+$ type diffusion region (source) 412 is connected to power supply terminal VB.

On the other hand, n type well regions 421 and 431 for forming the p-channel transistors MP3 and MP4 for a control circuit are formed in the $p^-$ type epitaxial layer 402, independently. The p-channel transistor MP3 having the horizontal structure is formed in the n type well region 421, and the p-channel transistor MP4 having the horizontal structure is formed in the n type well region 431.

In more detail, in the n type well region 421 are formed a $p^+$ type diffusion region 422 functioning as the source of the p-channel transistor MP3, a $p^+$ type diffusion region 423 functioning as the drain thereof, and an $n^+$ type diffusion region 425 functioning as the substrate terminal that connects the back gate (the n type well region 421) and a node N13. Also, on the n type well region 421 is formed a gate electrode 424 via a gate insulating layer which is connected to the logic circuit 301 through the node N12. Further, the $p^+$ type diffusion region (source) 422 is connected to the power supply terminal VB, and the $p^+$ type diffusion region (drain) 423 is connected to the node N14.

In the n type well region 431 are formed a $p^+$ type diffusion region 432 functioning as the source of the p-channel transistor MP4, a $p^+$ type diffusion region 433 functioning as the drain thereof, and an $n^+$ type diffusion region 435 functioning as the substrate terminal that connects the back gate (n type well region 431) and the power supply terminal VB. Also, a gate electrode 434 connected to the ground terminal GND is formed on the n type well region 431 via a gate insulating layer. Further, the $p^+$ type diffusion region (source) 432 is connected to the power supply terminal VB, and the $p^+$ type diffusion region (drain) 423 is connected to the node N13.

With the above configuration, in this embodiment, the back gate voltage of the p-channel transistor MP3 can be controlled by a drain voltage across the enhancement p-channel transistor MP4.

As illustrated in FIG. 19, parasitic PNP bipolar transistors Qp1c and Qp2d are formed in the p-channel transistors MP3 and MP4, respectively. In more detail, there are formed the parasitic PNP bipolar transistor Qp1c having the p+ type diffusion region 423, the n type well region 421, and the p− type epitaxial layer 402 (and the p+ type silicon substrate 401) as a collector, a base, and an emitter thereof, respectively, and the parasitic PNP bipolar transistor Qp2d having the p+ type diffusion region 433, the n type well region 431, and the p− type epitaxial layer 402 (and the p+ type silicon substrate 401) as a collector, a base, and an emitter thereof, respectively.

Figure 20:
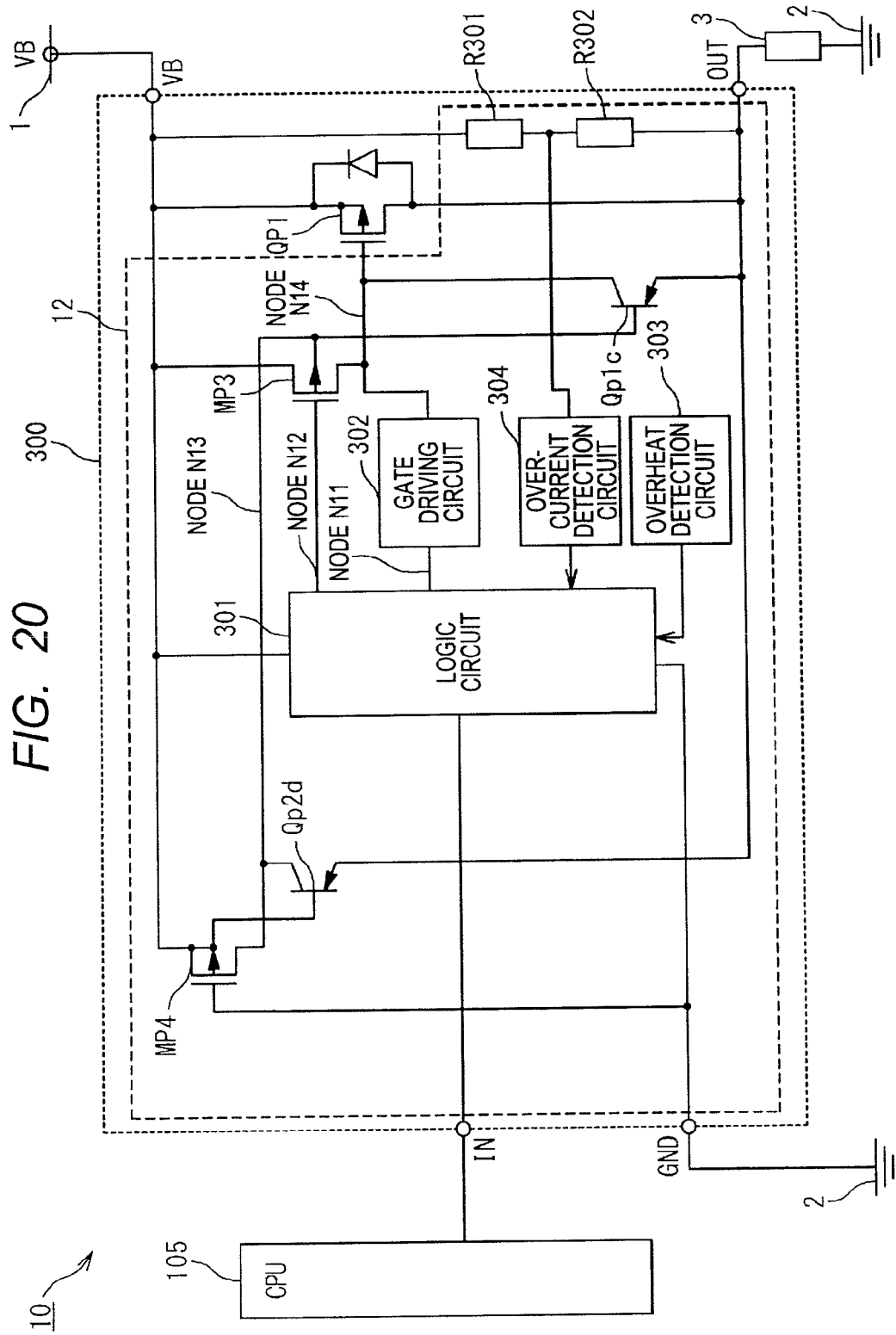
FIG. 20 is a diagram illustrating a configuration including a parasitic transistor that operates in the load driving device according to the fourth embodiment.

FIG. 20 is a circuit diagram illustrating a configuration of the load driving device 300 including the parasitic PNP bipolar transistors Qp1c and Qp2d according to the fourth embodiment. With the above configuration, the parasitic PNP bipolar transistor Qp1c has an emitter connected to the output terminal OUT, a collector connected to the node N14 (gate of the output transistor QP1), and a base connected to the back gate (substrate terminal) of the p-channel transistor MP3. The parasitic PNP bipolar transistor Qp2d has an emitter connected to the output terminal OUT, a collector connected to the back gate (substrate terminal) of the p-channel transistor MP3, and a base connected to the back gate (substrate terminal) of the p-channel transistor MP4.

Subsequently, a description will be given of the load driving operation of the load driving apparatus 10 (the load driving device 300) according to the fourth embodiment with reference to FIG. 18.

When a high-level signal is input to the input terminal IN from the CPU 105, the logic circuit 301 outputs the high-level signal to the node N11, and the gate driving circuit 302 outputs the high-level signal to the node N14. As a result, the output transistor QP1 turns off, and a current supply to the inductive load 3 is cutoff.

When a low-level signal is input to the input terminal IN from the CPU 105, the logic circuit 301 outputs the low-level signal to the node N11, and the gate driving circuit 302 outputs the low-level signal to the node N14. When the overheat detection circuit 303 or the overcurrent detection circuit 304 does not detect an abnormal state, the logic circuit 301 outputs the high-level signal to the node N12. As a result, the p-channel transistor MP3 does not turn on, thereby the output transistor QP1 turns on, and a current corresponding to the battery voltage VB is supplied to the inductive load 3. On the other hand, when the overheat detection circuit 303 or the overcurrent detection circuit 304 detects an abnormal state, the logic circuit 301 outputs the low-level signal to the node N12. As a result, the p-channel transistor MP3 turns on, thereby the output transistor QP1 turns off, and a current supply to the inductive load 3 is cutoff.

As described above, the load driving device 300 conducts current control on the inductive load 3 according to the control signal input from the CPU 105.

When a motor load (the inductive load 3) illustrated in FIG. 8 is driven with the use of the load driving apparatus 10 of the present invention, operation is conducted in the sequence shown in FIGS. 4A and 4C as in the related art. For example, when the output transistors of the load driving devices 100-2 and 300-1 turn on, and the output transistors of the load driving devices 100-1 and 300-2 turn off, the motor load is energized by the battery voltage VB as illustrated in FIG. 4A. In this situation, when a state in which the motor load is energized (FIG. 4A) transits to a disconnected state (for example, FIG. 4C), a current (negative current) in a direction opposite to that of the on-state current flows in the output transistor QP1 of the load driving device 300-2 due to the induced electromotive force attributable to the motor load. Referring to FIG. 8, when the output transistor of the load driving device 100-2 turns off and the output transistor of the load driving device 300-2 turns on, the motor load (the inductive load 3) is separated from the second power supply 2 and transit from the energized state to the disconnected state. In this case, a negative current (regenerative current) that circulates in the load driving device 300-1, the inductive load 3, and the load driving device 300-2 in the stated order is generated. A negative current flows in the output transistor QP1 of the load driving device 300-2 in a direction from the drain to the source (a direction opposite to that of the on-state current).

Referring to FIGS. 19 and 20, a description will be given of the operation of the load driving device 300 according to the fourth embodiment when the negative current (a current in a direction opposite to that of the on-state current; in this example, a current flowing from the drain to the source) flows in the output transistor QP1 of the load driving device 300.

Referring to FIG. 19, when a current flows from the drain of the output transistor QP1 to the source thereof, a current flows in a p-n junction formed between the p− type epitaxial layer 402 and each of the n type well regions 421 and 431 in a forward direction. As a result, a potential of the p− type epitaxial layer 402 is higher than each of the n type well regions 421 and 431 by about 0.7 V.

When the potential of the p− type epitaxial layer 402 becomes higher than the potential of the n type well region 431 by about 0.7 V, the parasitic PNP bipolar transistor Qp2d of the p-channel transistor MP4 turns on. In this example, the collector of the parasitic PNP bipolar transistor Qp2d is connected to the back gate (substrate terminal) of the p-channel transistor MP3 through the node N13. For that reason, the voltage across the p− type epitaxial layer 402 is applied to the back gate (substrate terminal) of the p-channel transistor MP3 through the parasitic PNP bipolar transistor Qp2d. In this case, since the voltage across the p− type epitaxial layer 402 in this situation is about power supply terminal VB+0.7 V, the back gate (the n type well region 421) of the p-channel transistor MP3 is also about power supply terminal VB+0.7 V. Accordingly, the power supply terminal VB+0.7 V is applied to both of the base and the emitter of the parasitic PNP bipolar transistor Qp1c formed in the p-channel transistor MP2, and the parasitic PNP bipolar transistor Qp1c is kept an off-state.

The above operation will be described with reference to FIG. 20. When the negative current flows in the output transistor QP1, the voltage across the output terminal OUT becomes the battery voltage VB (first supply voltage)+0.7 V. In this case, a voltage between the base and the emitter of the parasitic PNP bipolar transistor Qp2d is forwardly biased to turn on the parasitic PNP bipolar transistor Qp2d. As a result, the voltage (that is, battery voltage+0.7 V) across the output terminal OUT is applied to the back gate (substrate terminal) of the p-channel transistor MP3 through the parasitic PNP bipolar transistor Qp2d. As a result, the battery voltage VB+0.7 V is applied to both of the base and the emitter of the parasitic PNP bipolar transistor Qp1c to turn off the parasitic PNP bipolar transistor Qp1c.

In the related art, the p-channel transistor having the horizontal structure is formed in the same substrate together with the output transistor as the control circuit that controls the p-channel output transistor having the horizontal structure. In this case, when the state transits to the state shown in FIG. 4C, the parasitic PNP transistor formed in the load control circuit within the high side switch operates, and the output transistor Q4 shown in FIG. 4C turns off. In this case, because the negative current (regenerative current) attributable to the induced electromotive force of the inductive load 3 flows through the body diode of the output transistor Q4, the power loss increases.

On the contrary, according to this embodiment, the negative current flowing in the output transistor QP1 allows the parasitic PNP transistor Qp1c provided in the p-channel transistor MP3 to turn off, and the output transistor QP1 not to turn off. For that reason, control can be conducted so that the output transistor QP1 surely turns on even while the negative current flows. As a result, the power loss caused by the negative current can be reduced.

The embodiments of the present invention have been described above in detail. However, the specific configuration is not limited to the above embodiments, but is encompassed in the present invention with any modification without departing from the subject matter of the invention. The first to fourth embodiments can be implemented in combination without contradiction.

What is claimed is:

1. A load driving device, comprising:
   an output transistor having a vertical structure which controls supply of current to an inductive load according to a gate voltage;
   a first transistor having a horizontal structure which controls a magnitude of a gate voltage across the output transistor; and
   a second transistor having a horizontal structure which controls application of voltage to a back gate of the first transistor,
   wherein the output transistor, the first transistor, and the second transistor are transistors of the same conduction type formed in the same substrate,
   wherein the output transistor has a drain connected to a first power supply through an inductive load, and a source connected to a second power supply that applies a supply voltage different in the first power supply,
   wherein when an on-state current flows in the output transistor, the second transistor applies the supply voltage applied to the source of the output transistor to the back gate of the first transistor, and
   wherein when a negative current in a direction opposite to that of the on-state current flows in the output transistor, the second transistor applies the supply voltage applied to the drain of the output transistor to the back gate of the first transistor.

2. The load driving device according to claim 1,
   wherein the second transistor is a depletion type transistor, and has a drain connected to the back gate of the first transistor, and a source and a gate connected to the second power supply.

3. The load driving device according to claim 1,
   wherein the second transistor is an enhancement transistor, and has a drain connected to the back gate of the first transistor, a source connected to the second power supply, and a gate connected to a third power supply that applies a voltage of a threshold voltage or higher.

4. The load driving device according to claim 1, further comprising:
   a state detection circuit that detects a state of the output transistor; and
   a logic circuit that outputs a control signal corresponding to the detection result to the gate of the first transistor.

5. The load driving device according to claim 4,
   wherein the drain of the first transistor is connected to a third supply voltage through a load, and connected to a CPU through a self-diagnostic output terminal, and the source of the first transistor is connected to the second power supply, and outputs a self-diagnostic signal corresponding to the control signal to the self-diagnostic output terminal, and
   wherein the logic circuit outputs the control signal on the basis of a signal output from the CPU in response to the self-diagnostic signal.

6. The load driving device according to claim 4,
   wherein the drain of the first transistor is connected to the gate of the output transistor, and the source of the first transistor is connected to the second power supply, and controls the gate voltage of the output transistor in response to the control signal.

7. The load driving device according to claim 4,
   wherein the state detection circuit includes an overheat detection circuit that monitors an ambient temperature of the output transistor.

8. The load driving device according to claim 4,
   wherein the state detection circuit includes an overcurrent detection circuit that monitors a current value flowing in the output transistor.

9. The load driving device according to claim 1,
   wherein the output transistor, the first transistor, and the second transistor are n-channel transistors formed in an n type substrate to configure a low-side switch in an H-bridge connected to the inductive load.

10. The load driving device according to claim 1,
    wherein the output transistor, the first transistor, and the second transistor are p-channel transistors formed in a p type substrate to configure a high-side switch in an H-bridge connected to the inductive load.

* * * * *